United States Patent
Maehata et al.

(10) Patent No.: US 10,607,874 B2
(45) Date of Patent: Mar. 31, 2020

(54) ELECTROSTATIC CHUCK

(71) Applicant: TOTO LTD., Kitakyushu-shi, Fukuoka (JP)

(72) Inventors: Kengo Maehata, Fukuoka (JP); Shumpei Kondo, Fukuoka (JP); Hitoshi Sasaki, Fukuoka (JP); Kosuke Yamaguchi, Fukuoka (JP); Yuichi Yoshii, Fukuoka (JP)

(73) Assignee: Toto Ltd., Fukuoka (JP)

( * ) Notice: Subject to any disclaimer, the term of this patent is extended or adjusted under 35 U.S.C. 154(b) by 341 days.

(21) Appl. No.: 15/647,369

(22) Filed: Jul. 12, 2017

(65) Prior Publication Data

US 2017/0309510 A1    Oct. 26, 2017

Related U.S. Application Data

(63) Continuation of application No. PCT/JP2016/051182, filed on Jan. 15, 2016.

(30) Foreign Application Priority Data

Jan. 16, 2015  (JP) .................................. 2015-007208
Sep. 28, 2015  (JP) .................................. 2015-190103
Jan. 14, 2016  (JP) .................................. 2016-005348

(51) Int. Cl.
   *H05B 3/68*   (2006.01)
   *H05B 3/10*   (2006.01)
   (Continued)

(52) U.S. Cl.
   CPC ............ *H01L 21/6833* (2013.01); *B23Q 3/15* (2013.01); *H01L 21/67103* (2013.01);
   (Continued)

(58) Field of Classification Search
   CPC ................ B23Q 3/15; H01L 21/67103; H01L 21/67109; H01L 21/67248; H01L 21/6831;
   (Continued)

(56) References Cited

U.S. PATENT DOCUMENTS

5,376,213 A  * 12/1994  Ueda .................. C23C 16/4586
                                              156/345.27
2001/0035403 A1 * 11/2001  Wang ................ H01L 21/67103
                                              219/444.1
(Continued)

FOREIGN PATENT DOCUMENTS

JP    62-133721 A    6/1987
JP    08-125001 A    5/1996
(Continued)

*Primary Examiner* — Sang Y Paik
(74) *Attorney, Agent, or Firm* — Carrier Blackman & Associates, P.C.; Joseph P. Carrier; Jeffrey T. Gedeon

(57) ABSTRACT

According to one embodiment, an electrostatic chuck includes a ceramic dielectric substrate, a base plate, and a heater plate. The ceramic dielectric substrate has a surface where a processing object is placed. The base plate supports the ceramic dielectric substrate. The heater plate is provided between the ceramic dielectric substrate and the base plate. The heater plate includes a first support plate including a metal, a second support plate including a metal, a heater element, a first resin layer, and a second resin layer. The heater element is provided between the first support plate and the second support plate. The heater element emits heat due to a current flowing. The first resin layer is provided between the first support plate and the heater element. The second resin layer is provided between the second support plate and the heater element.

22 Claims, 24 Drawing Sheets

(51) Int. Cl.
  *H01L 21/683* (2006.01)
  *B23Q 3/15* (2006.01)
  *H01L 21/687* (2006.01)
  *H01L 21/67* (2006.01)
  *H02N 13/00* (2006.01)

(52) U.S. Cl.
  CPC .. *H01L 21/67109* (2013.01); *H01L 21/67248* (2013.01); *H01L 21/6831* (2013.01); *H01L 21/68757* (2013.01); *H01L 21/68785* (2013.01); *H02N 13/00* (2013.01)

(58) Field of Classification Search
  CPC ........... H01L 21/6833; H01L 21/68757; H01L 21/68785; H02N 13/00
  USPC ............ 219/443.1, 444.1, 538–548
  See application file for complete search history.

(56) References Cited

U.S. PATENT DOCUMENTS

| | | | |
|---|---|---|---|
| 2002/0043530 A1* | 4/2002 | Ito | H05B 3/143 219/544 |
| 2002/0075624 A1* | 6/2002 | Wang | C04B 37/006 361/234 |
| 2004/0175549 A1* | 9/2004 | Ito | B32B 18/00 428/209 |
| 2006/0005930 A1 | 1/2006 | Ikeda et al. | |
| 2006/0199135 A1* | 9/2006 | Mashima | H01L 21/67103 432/214 |
| 2012/0285619 A1* | 11/2012 | Matyushkin | H01L 21/67109 156/345.1 |
| 2013/0279066 A1 | 10/2013 | Lubomirsky et al. | |

FOREIGN PATENT DOCUMENTS

| | | |
|---|---|---|
| JP | H10-064984 A | 3/1998 |
| JP | 2000-031253 A | 1/2000 |
| JP | 2001-237301 A | 8/2001 |
| JP | 2006-040993 A | 2/2006 |
| JP | 2007-067036 A | 3/2007 |
| JP | 2010-040644 A | 2/2010 |

* cited by examiner

ELECTROSTATIC CHUCK

CROSS-REFERENCE TO RELATED APPLICATIONS

This is a continuation application of International Application PCT/JP2016/051182, filed on Jan. 15, 2016. This application also claims priority to Japanese Application No. 2015-007208, filed on Jan. 16, 2015, Japanese Application No. 2015-190103, filed on Sep. 28, 2015, and Japanese Application No. 2016-005348, filed on Jan. 14, 2016; the entire contents of each are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber in which etching, CVD (Chemical Vapor Deposition), sputtering, ion implantation, ashing, etc., are performed. The electrostatic chuck attracts and holds a substrate such as a silicon wafer, etc., using an electrostatic force by applying electrical power for the electrostatic attraction to a built-in electrode.

It is desirable to perform the temperature control of the wafer in the substrate processing apparatus including such an electrostatic chuck to increase the yield and improve the quality. Two types of performance are desirable for the temperature control of the wafer. One type of performance is the temperature uniformity in which the temperature distribution in the plane of the wafer is caused to be uniform. The other type of performance is temperature controllability in which a difference is deliberately provided to the temperature in the plane of the wafer. The performance of the heater built into the electrostatic chuck is one important component of the temperature control of the wafer. Generally, the temperature uniformity has a trade-off relationship with the temperature controllability.

Higher throughput of the substrate processing apparatus also is desirable. To realize higher throughput of the substrate processing apparatus, it is favorable for the thermal capacity of the heater built into the electrostatic chuck to be relatively small.

An RF (Radio Frequency) voltage (high frequency voltage) is applied in the processes of wafer patterning. When the RF voltage is applied, a general heater is affected by the high frequency waves and generates heat. The temperature controllability degrades thereby. Also, when the RF voltage is applied, a leakage current flows in the equipment side. Therefore, a mechanism such as a filter or the like is necessary on the equipment side.

In the case where the heater is built into the electrostatic chuck, the reliability of the method (e.g., the coupling method) used to build the heater into the electrostatic chuck is one important component.

In the processes of the plasma etching apparatus, etc., plasma of various intensities and various distributions is irradiated on the wafer. When the plasma is irradiated on the wafer, it is desirable to control the temperature of the wafer to be a temperature suited to the process. Also, when the plasma is irradiated on the wafer, temperature uniformity and temperature controllability are desirable. To increase the productivity, it is desirable to cause the temperature of the wafer to reach the prescribed temperature in a relatively short period of time. High reliability is desirable for the electrostatic chuck and the wafer even for abrupt temperature changes, when heat is supplied, and when a high frequency voltage is applied. It is difficult to satisfy such needs simultaneously.

SUMMARY

According to an embodiment of the invention, an electrostatic chuck is provided that includes a ceramic dielectric substrate, a base plate, and a heater plate, wherein the ceramic dielectric substrate has a first major surface and a second major surface, the first major surface is where a processing object is placed, the second major surface is on a side opposite to the first major surface, the base plate supports the ceramic dielectric substrate and is provided at a position separated from the ceramic dielectric substrate, the heater plate is provided between the ceramic dielectric substrate and the base plate, the heater plate includes a first support plate, a second support plate, a heater element, a first resin layer, and a second resin layer, the first support plate includes a metal, the second support plate includes a metal, the heater element is provided between the first support plate and the second support plate and generates heat due to a current flowing, the first resin layer is provided between the first support plate and the heater element, and the second resin layer is provided between the second support plate and the heater element.

DETAILED DESCRIPTION

Figure 1:
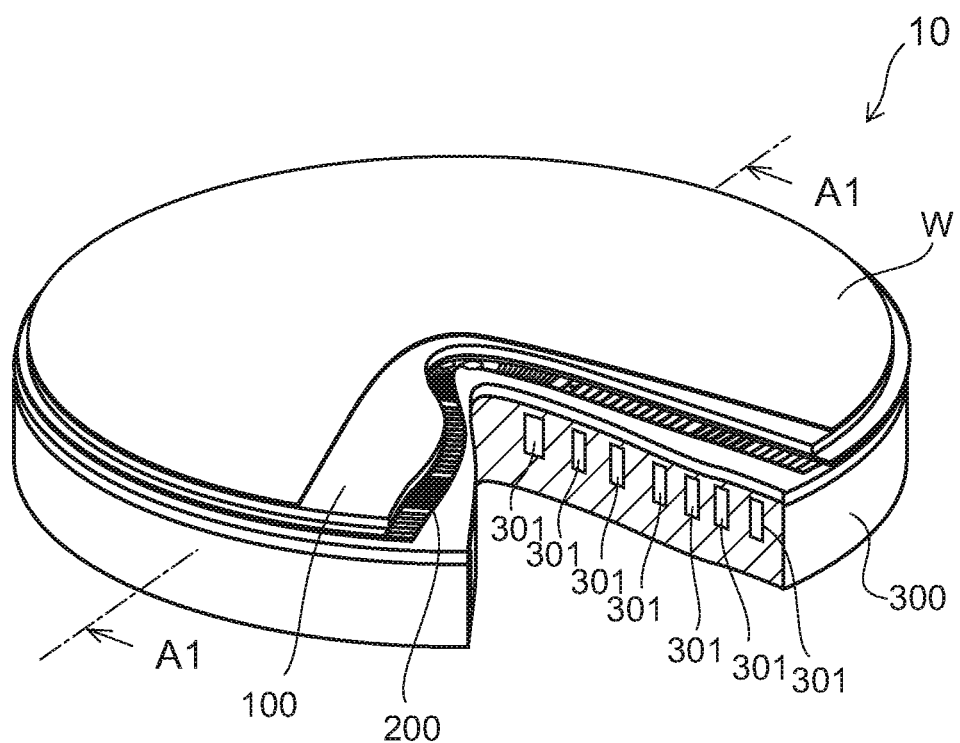
FIG. 1 is a schematic perspective view illustrating an electrostatic chuck according to the embodiment.
Figure 1:
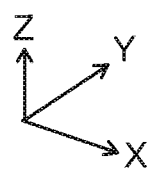

A first invention is an electrostatic chuck including a ceramic dielectric substrate, a base plate, and a heater plate, wherein the ceramic dielectric substrate has a first major surface and a second major surface, the first major surface is where a processing object is placed, the second major surface is on a side opposite to the first major surface, the base plate is provided at a position separated from the ceramic dielectric substrate and supports the ceramic dielectric substrate, the heater plate is provided between the ceramic dielectric substrate and the base plate, the heater plate includes a first support plate, a second support plate, a heater element, a first resin layer, and a second resin layer, the first support plate includes a metal, the second support plate includes a metal, the heater element is provided between the first support plate and the second support plate and generates heat due to a current flowing, the first resin layer is provided between the first support plate and the heater element, and the second resin layer is provided between the second support plate and the heater element.

According to the electrostatic chuck, the heater element is provided between the first support plate and the second support plate. Thereby, the uniformity of the temperature distribution in the plane of the heater plate can be improved; and the uniformity of the temperature distribution in the plane of the processing object can be increased. Also, the first support plate and the second support plate shield the heater element from high frequency waves; and the heat generation of the heater element to an abnormal temperature can be suppressed.

A second invention is the electrostatic chuck of the first invention in which the first support plate is electrically coupled to the second support plate.

According to the electrostatic chuck, the heater element can be shielded from high frequency waves. Thereby, the heat generation of the heater element to an abnormal temperature can be suppressed. Also, the impedance of the heater plate can be suppressed.

A third invention is the electrostatic chuck of the second invention in which the surface area of the region where the first support plate is coupled to the second support plate is narrower than the surface area of the upper surface of the first support plate and narrower than the surface area of the lower surface of the second support plate.

According to the electrostatic chuck, the heater element can be shielded from high frequency waves. Thereby, the heat generation of the heater element to an abnormal temperature can be suppressed. Also, the impedance of the heater plate can be suppressed.

A fourth invention is the electrostatic chuck of the third invention in which the surface area of the region where the first support plate is coupled to the second support plate is narrower than the surface area difference of the surface area of the heater element subtracted from the surface area of the upper surface of the first support plate and narrower than the surface area difference of the surface area of the heater element subtracted from the surface area of the lower surface of the second support plate.

According to the electrostatic chuck, for example, the transfer to the second support plate via the coupling portion of the heat supplied from the heater element can be suppressed. For example, the uniformity of the temperature distribution in the plane of the processing object can be increased.

A fifth invention is the electrostatic chuck of any one of the first to fourth inventions in which the upper surface of the first support plate has a first unevenness; and the lower surface of the second support plate has a second unevenness.

According to the electrostatic chuck, because the upper surface of the first support plate has the first unevenness, the bonding surface area between the first support plate and the heater element can be wider; and the bonding strength between the first support plate and the heater element can be increased. Also, because the lower surface of the second support plate has the second unevenness, the bonding surface area between the second support plate and the heater element can be wider; and the bonding strength between the second support plate and the heater element can be increased. Because the upper surface of the first support plate has the first unevenness, the distance between the heater element and the processing object can be shorter. Thereby, the speed of increasing the temperature of the processing object can be increased.

A sixth invention is the electrostatic chuck of the fifth invention in which the first unevenness follows the configuration of the heater element; and the second unevenness follows the configuration of the heater element.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. The distance between the heater element and the processing object can be shorter. Thereby, the speed of increasing the temperature of the processing object can be increased.

A seventh invention is the electrostatic chuck of the sixth invention in which the distance between the recess of the first unevenness and the recess of the second unevenness is shorter than the distance between the protrusion of the first unevenness and the protrusion of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. The distance between the heater element and the processing object can be shorter. Thereby, the speed of increasing the temperature of the processing object can be increased.

An eighth invention is the electrostatic chuck of any one of the fifth to seventh inventions in which the height of the first unevenness is different from the height of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. The distance between the heater element and the processing object can be shorter. Thereby, the speed of increasing the temperature of the processing object can be increased.

A ninth invention is the electrostatic chuck of the eighth invention in which the height of the first unevenness is lower than the height of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. The distance between the heater element and the processing object can be shorter. Thereby, the speed of increasing the temperature of the processing object can be increased.

A tenth invention is the electrostatic chuck of the eighth invention in which the height of the first unevenness is higher than the height of the second unevenness.

According to the electrostatic chuck, the bonding surface area between the heater plate and the ceramic dielectric substrate can be wider; and the bonding strength between the heater plate and the ceramic dielectric substrate can be increased.

An eleventh invention is the electrostatic chuck of any one of the first to tenth inventions in which the heater element includes a heater electrode having a band configuration; and the heater electrode is provided in a state of being mutually-independent in multiple regions.

According to the electrostatic chuck, because the heater electrode is provided in the state of being mutually-independent in the multiple regions, the temperature in the plane of the processing object can be controlled independently for each region. Thereby, a difference of the temperature in the plane of the processing object can be provided deliberately (temperature controllability).

A twelfth invention is the electrostatic chuck of any one of the first to eleventh inventions in which the heater element is multiply provided; and the multiple heater elements are provided in a state of being independent in mutually-different layers.

According to the electrostatic chuck, because the heater elements are provided in the state of being independent in mutually-different layers, the temperature in the plane of the processing object can be controlled independently for each region. Thereby, a difference of the temperature in the plane of the processing object can be provided deliberately (temperature controllability).

A thirteenth invention is the electrostatic chuck of any one of the first to eleventh inventions, further including a bypass layer that is electrically conductive and is provided between the heater element and the second support plate.

According to the electrostatic chuck, more degrees of freedom for the arrangement of the terminals supplying the electrical power to the heater element can be provided. By providing the bypass layer, compared to the case where the bypass layer is not provided, the terminals that have large thermal capacities may not be directly coupled to the heater element. Thereby, the uniformity of the temperature distribution in the plane of the processing object can be increased. Also, compared to the case where the bypass layer is not provided, the terminals may not be coupled to the heater element which is thin. Thereby, the reliability of the heater plate can be increased.

A fourteenth invention is the electrostatic chuck of the thirteenth invention in which the heater element is electrically coupled to the bypass layer and is electrically insulated from the first support plate and the second support plate.

According to the electrostatic chuck, the electrical power can be supplied from the outside to the heater element via the bypass layer.

A fifteenth invention is the electrostatic chuck of the thirteenth or fourteenth inventions in which the thickness of the bypass layer is thicker than the thickness of the first resin layer.

According to the electrostatic chuck, more degrees of freedom for the arrangement of the terminals supplying the electrical power to the heater element can be provided. The electrical resistance of the bypass layer can be suppressed; and the heat generation amount of the bypass layer can be suppressed.

A sixteenth invention is the electrostatic chuck of any one of the thirteenth to fifteenth inventions in which the thickness of the bypass layer is thicker than the thickness of the heater element.

According to the electrostatic chuck, more degrees of freedom for the arrangement of the terminals supplying the electrical power to the heater element can be provided. The electrical resistance of the bypass layer can be suppressed; and the heat generation amount of the bypass layer can be suppressed.

A seventeenth invention is the electrostatic chuck of any one of the thirteenth to sixteenth inventions in which the bypass layer is provided between the heater element and the base plate.

According to the electrostatic chuck, the bypass layer suppresses the transfer of the heat supplied from the heater element to the base plate. That is, the bypass layer has a thermal insulation effect for the base plate side when viewed from the bypass layer; and the uniformity of the temperature distribution in the plane of the processing object can be increased.

An eighteenth invention is the electrostatic chuck of any one of the first to seventeenth inventions, further including a bypass layer that is electrically conductive and is provided between the heater element and the ceramic dielectric substrate.

According to the electrostatic chuck, the diffusability of the heat supplied from the heater element can be improved by the bypass layer. In other words, the bypass layer improves the thermal diffusion in the in-plane direction of the processing object. Thereby, for example, the uniformity of the temperature distribution in the plane of the processing object can be increased.

A nineteenth invention is the electrostatic chuck of any one of the first to eighteenth inventions in which the surface area of the upper surface of the first support plate is greater than the surface area of the lower surface of the second support plate.

According to the electrostatic chuck, the terminals supplying the electrical power to the heater element can be connected more easily at the second support plate side when viewed from the heater element.

A twentieth invention is the electrostatic chuck of any one of the first to nineteenth inventions in which the first support plate includes multiple support portions; and the multiple support portions are provided in a state of being mutually-independent.

According to the electrostatic chuck, a temperature difference in the diametrical direction can be provided deliberately in the plane of the first support plate (temperature controllability). For example, a temperature difference can be provided in a step configuration from the central portion to the outer perimeter portion in the plane of the first support plate. Thereby, a temperature difference can be provided deliberately in the plane of the processing object (temperature controllability).

A twenty-first invention is the electrostatic chuck of any one of the first to twentieth inventions, further including a power supply terminal provided from the heater plate toward the base plate, wherein the power supply terminal supplies electrical power to the heater plate.

According to the electrostatic chuck, because the power supply terminal is provided from the heater plate toward the base plate, the electrical power can be supplied to the power supply terminal from the lower surface side of the base plate via a member called a socket, etc. Thereby, the wiring of the heater is realized while suppressing the exposure of the power supply terminal inside the chamber where the electrostatic chuck is mounted.

A twenty-second invention is the electrostatic chuck of the twenty-first invention in which the power supply terminal includes a pin portion, a conducting lead portion, a support portion, and a coupling portion; the pin portion is connected to a socket supplying electrical power from the outside; the conducting lead portion is finer than the pin portion; the support portion is connected to the conducting lead portion; and the coupling portion is connected to the support portion and coupled to the heater element.

According to the electrostatic chuck, because the pin portion is wider than the conducting lead portion, the pin portion can supply a relatively large current to the heater element. Because the conducting lead portion is finer than the pin portion, the conducting lead portion is deformed more easily than the pin portion; and the position of the pin portion can be shifted from the center of the coupling portion. Thereby, the power supply terminal can be fixed to a member (e.g., the base plate) that is different from the heater plate. In the case where the support portion is coupled to the conducting lead portion and the coupling portion by, for example, welding, coupling utilizing a laser beam, soldering brazing, etc., a wider contact surface area with the heater element can be ensured while relaxing the stress applied to the power supply terminal.

A twenty-third invention is the electrostatic chuck of any one of the thirteenth to seventeenth inventions, further including a power supply terminal provided from the heater plate toward the base plate, wherein the power supply terminal supplies electrical power to the heater plate, the power supply terminal includes a pin portion, a conducting lead portion, a support portion, and a coupling portion, the pin portion is connected to a socket supplying electrical power from the outside, the conducting lead portion is finer than the pin portion, the support portion is connected to the conducting lead portion, the coupling portion is connected to the support portion and coupled to the bypass layer, and the electrical power is supplied to the heater element via the bypass layer.

According to the electrostatic chuck, because the pin portion is wider than the conducting lead portion, the pin portion can supply a relatively large current to the heater element. Because the conducting lead portion is finer than the pin portion, the conducting lead portion is deformed more easily than the pin portion; and the position of the pin portion can be shifted from the center of the coupling portion. Thereby, the power supply terminal can be fixed to a member (e.g., the base plate) that is different from the heater plate. In the case where the support portion is coupled to the conducting lead portion and the coupling portion by, for example, welding, coupling utilizing a laser beam, soldering brazing, etc., a wider contact surface area with the bypass layer can be ensured while relaxing the stress applied to the power supply terminal. In the case where the support portion is coupled to the conducting lead portion and the coupling portion by, for example, welding, coupling utilizing a laser beam, soldering, brazing, etc., a coupling portion that has substantially the same thickness as the heater plate and the bypass layer can be provided.

According to the embodiment of the invention, an electrostatic chuck is provided that satisfies temperature uniformity and temperature controllability.

Embodiments of the invention will now be described with reference to the drawings. Similar components in the drawings are marked with the same reference numerals; and a detailed description is omitted as appropriate.

FIG. 1 is a schematic perspective view illustrating an electrostatic chuck according to the embodiment.

Figure 2A:
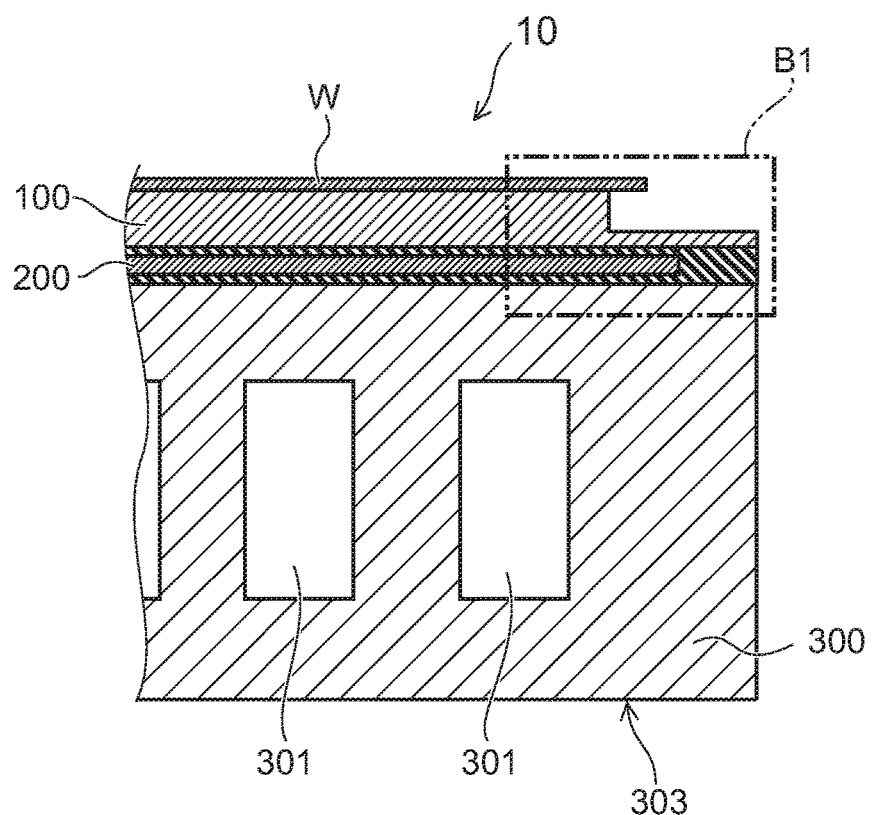
FIGS. 2A and 2B are schematic cross-sectional views illustrating the electrostatic chuck according to the embodiment.
Figure 2B:
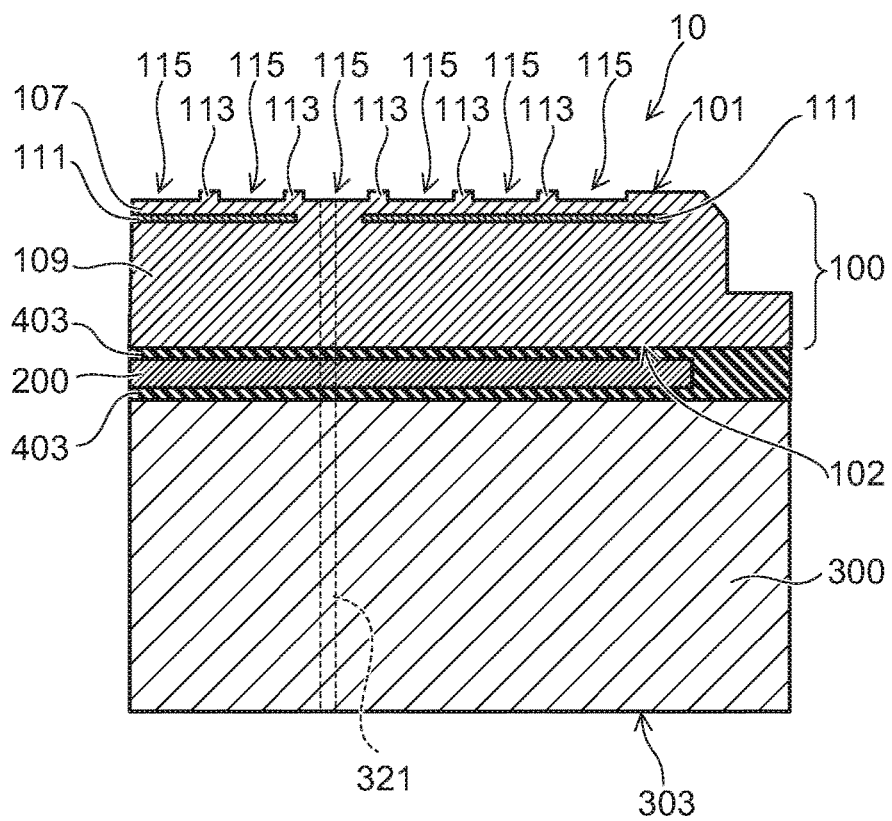

FIGS. 2A and 2B are schematic cross-sectional views illustrating the electrostatic chuck according to the embodiment.

In FIG. 1, a cross-sectional view of a portion of the electrostatic chuck is illustrated for convenience of description. FIG. 2A is, for example, a schematic cross-sectional view of an A1-A1 cross section illustrated in FIG. 1. FIG. 2B is an enlarged schematic view of region B1 illustrated in FIG. 2A.

The electrostatic chuck 10 according to the embodiment includes a ceramic dielectric substrate 100, a heater plate 200, and a base plate 300.

The ceramic dielectric substrate 100 is provided at a position separated from the base plate 300. The heater plate 200 is provided between the base plate 300 and the ceramic dielectric substrate 100.

A bonding agent 403 is provided between the base plate 300 and the heater plate 200. The bonding agent 403 is provided between the heater plate 200 and the ceramic dielectric substrate 100. A heat-resistant resin such as silicone that has a relatively high thermal conductivity or the like is an example of the material of the bonding agent 403. The thickness of the bonding agent 403 is, for example, not less than about 0.1 millimeters (mm) and not more than about 1.0 mm. The thickness of the bonding agent 403 is the same as the distance between the base plate 300 and the heater plate 200 or the distance between the heater plate 200 and the ceramic dielectric substrate 100.

The ceramic dielectric substrate 100 is, for example, a base material having a flat plate configuration made of a polycrystalline ceramic sintered body, has a first major surface 101 where a processing object W such as a semiconductor wafer or the like is placed, and has a second major surface 102 on the side opposite to the first major surface 101.

Here, in the description of the embodiment, a direction connecting the first major surface 101 and the second major surface 102 is taken as a Z-direction; one direction orthogonal to the Z-direction is taken as an X-direction; and a direction orthogonal to the Z-direction and the X-direction is taken as a Y-direction.

For example, $Al_2O_3$, $Y_2O_3$, YAG, etc., are examples of the material of the crystal included in the ceramic dielectric substrate 100. By using such materials, the infrared transmissivity, the insulation stability, and the plasma resistance of the ceramic dielectric substrate 100 can be increased.

An electrode layer 111 is provided in the interior of the ceramic dielectric substrate 100. The electrode layer 111 is interposed between the first major surface 101 and the second major surface 102. In other words, the electrode layer 111 is formed to be inserted into the ceramic dielectric substrate 100. The electrode layer 111 is sintered as one body with the ceramic dielectric substrate 100.

The electrode layer 111 is not limited to being interposed between the first major surface 101 and the second major surface 102 and may be accessorily provided at the second major surface 102.

By applying an attracting/holding voltage to the electrode layer 111, the electrostatic chuck 10 generates a charge on the first major surface 101 side of the electrode layer 111 and holds the processing object W by an electrostatic force.

The heater plate 200 generates heat due to the flow of a heater current and can increase the temperature of the processing object W compared to the case where the heater plate 200 does not generate heat.

The electrode layer 111 is provided along the first major surface 101 and the second major surface 102. The electrode layer 111 is an attraction electrode for attracting and holding the processing object W. The electrode layer 111 may be a unipole-type or a dipole-type. The electrode layer 111 also may be a tripole-type or another multi-pole type. The number of the electrode layers 111 and the arrangement of the electrode layers 111 are appropriately selected.

The ceramic dielectric substrate 100 includes a first dielectric layer 107 between the electrode layer 111 and the first major surface 101, and a second dielectric layer 109 between the electrode layer 111 and the second major surface 102. In the ceramic dielectric substrate 100, it is favorable for the infrared spectral transmittance of at least the first dielectric layer 107 to be 20% or more. In the embodiment, the infrared spectral transmittance is a value converted to a thickness of 1 mm.

The infrared rays that are emitted from the heater plate 200 in the state in which the processing object W is placed on the first major surface 101 can efficiently pass through the ceramic dielectric substrate 100 by setting the infrared spectral transmittance of at least the first dielectric layer 107 of the ceramic dielectric substrate 100 to be 20% or more. Accordingly, the heat does not accumulate easily in the processing object W; and the controllability of the temperature of the processing object W increases.

For example, in the case where the electrostatic chuck 10 is used inside a chamber in which the plasma processing is performed, the temperature of the processing object W increases more easily as the plasma power increases. In the electrostatic chuck 10 of the embodiment, the heat that is transferred to the processing object W by the plasma power is transferred efficiently to the ceramic dielectric substrate 100. Further, the heat that is transferred to the ceramic dielectric substrate 100 by the heater plate 200 is transferred efficiently to the processing object W. Accordingly, the processing object W is maintained more easily at the desired temperature by efficiently transferring heat.

In the electrostatic chuck 10 according to the embodiment, it is desirable for the infrared spectral transmittance of the second dielectric layer 109, in addition to the first dielectric layer 107, to be 20% or more. By setting the infrared spectral transmittances of the first dielectric layer 107 and the second dielectric layer 109 to be 20% or more, the infrared rays emitted from the heater plate 200 pass through the ceramic dielectric substrate 100 more efficiently; and the temperature controllability of the processing object W can be increased.

The base plate 300 is provided on the second major surface 102 side of the ceramic dielectric substrate 100 and supports the ceramic dielectric substrate 100 via the heater plate 200. A passageway 301 is provided in the base plate 300. Namely, the passageway 301 is provided in the interior of the base plate 300. For example, aluminum is an example of the material of the base plate 300.

The base plate 300 performs the role of the temperature adjustment of the ceramic dielectric substrate 100. For example, in the case where the ceramic dielectric substrate 100 is cooled, a cooling medium is caused to flow into the passageway 301 and pass through the passageway 301; and the cooling medium is caused to flow out from the passageway 301. Thereby, the heat of the base plate 300 is absorbed by the cooling medium; and the ceramic dielectric substrate 100 that is mounted on the base plate 300 can be cooled.

On the other hand, in the case where the ceramic dielectric substrate 100 is heated, it is also possible to provide a heating medium into the passageway 301. Or, it is also possible for a not-illustrated heater to be built into the base plate 300. Thus, when the temperature of the ceramic dielectric substrate 100 is adjusted by the base plate 300, the temperature of the processing object W held by the electrostatic chuck 10 can be adjusted easily.

Protrusions 113 are provided as necessary on the first major surface 101 side of the ceramic dielectric substrate 100. Grooves 115 are provided between the protrusions 113 adjacent to each other. The grooves 115 communicate with each other. A space is formed between the grooves 115 and the back surface of the processing object W placed on the electrostatic chuck 10.

An introduction path 321 that pierces the base plate 300 and the ceramic dielectric substrate 100 is connected to the grooves 115. If a transfer gas such as helium (He) or the like is introduced from the introduction path 321 in the state in which the processing object W is held, the transfer gas flows in the space provided between the processing object W and the grooves 115; and the processing object W can be directly heated or cooled by the transfer gas.

Figure 3:
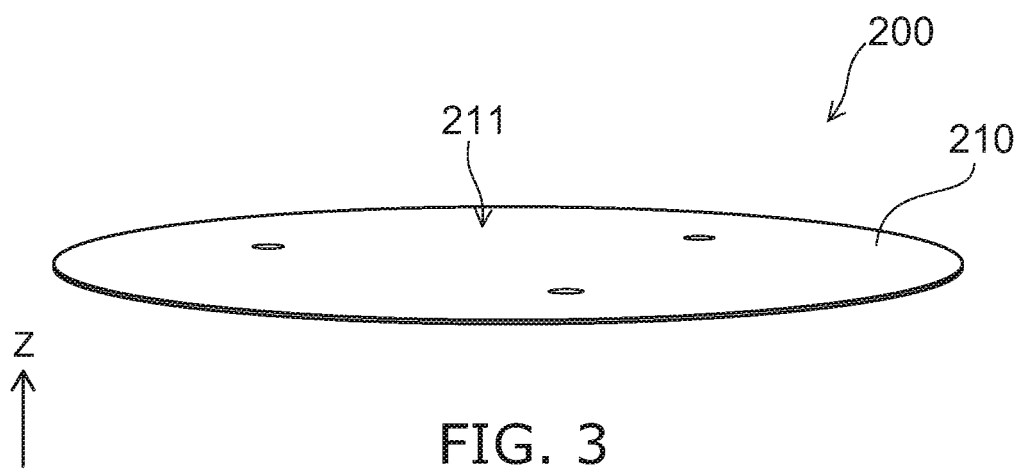
FIG. 3 is a schematic perspective view illustrating the heater plate of the embodiment.

FIG. 3 is a schematic perspective view illustrating the heater plate of the embodiment.

Figure 4A:
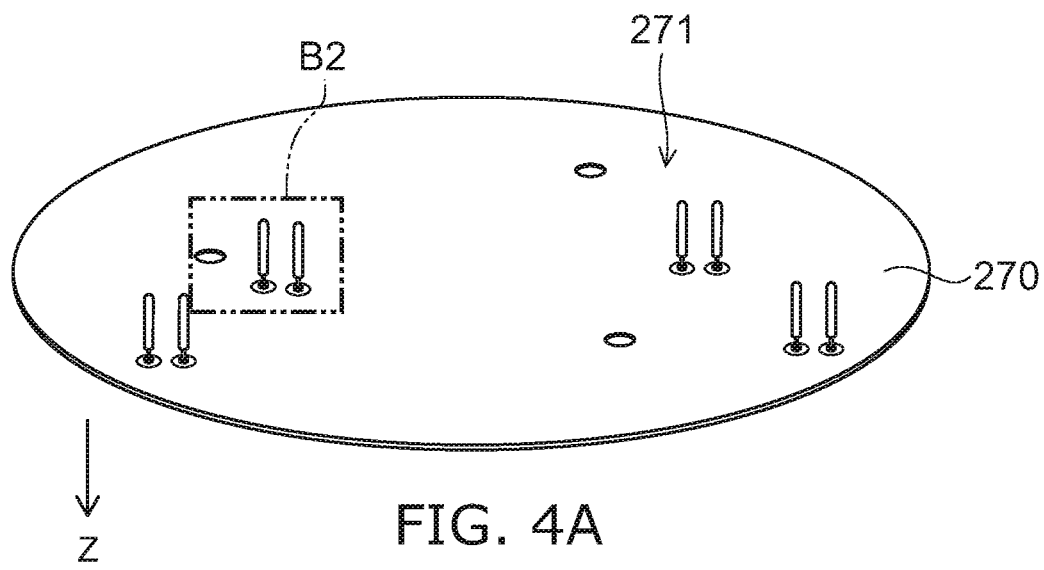
FIGS. 4A and 4B are schematic perspective views illustrating the heater plate of the embodiment.
Figure 4B:
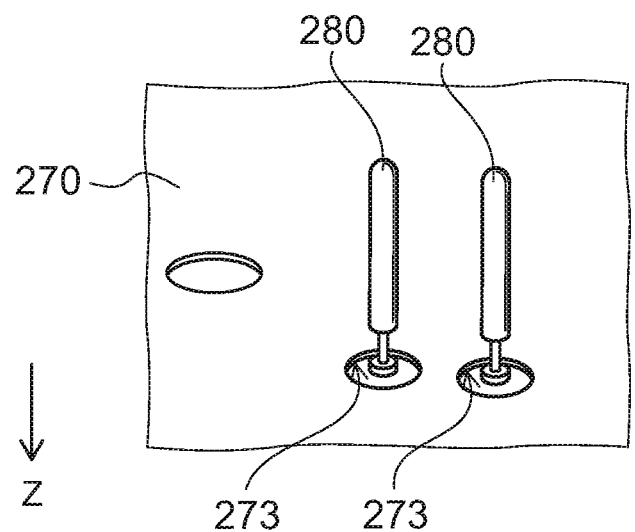

FIGS. 4A and 4B are schematic perspective views illustrating the heater plate of the embodiment.

Figure 5:
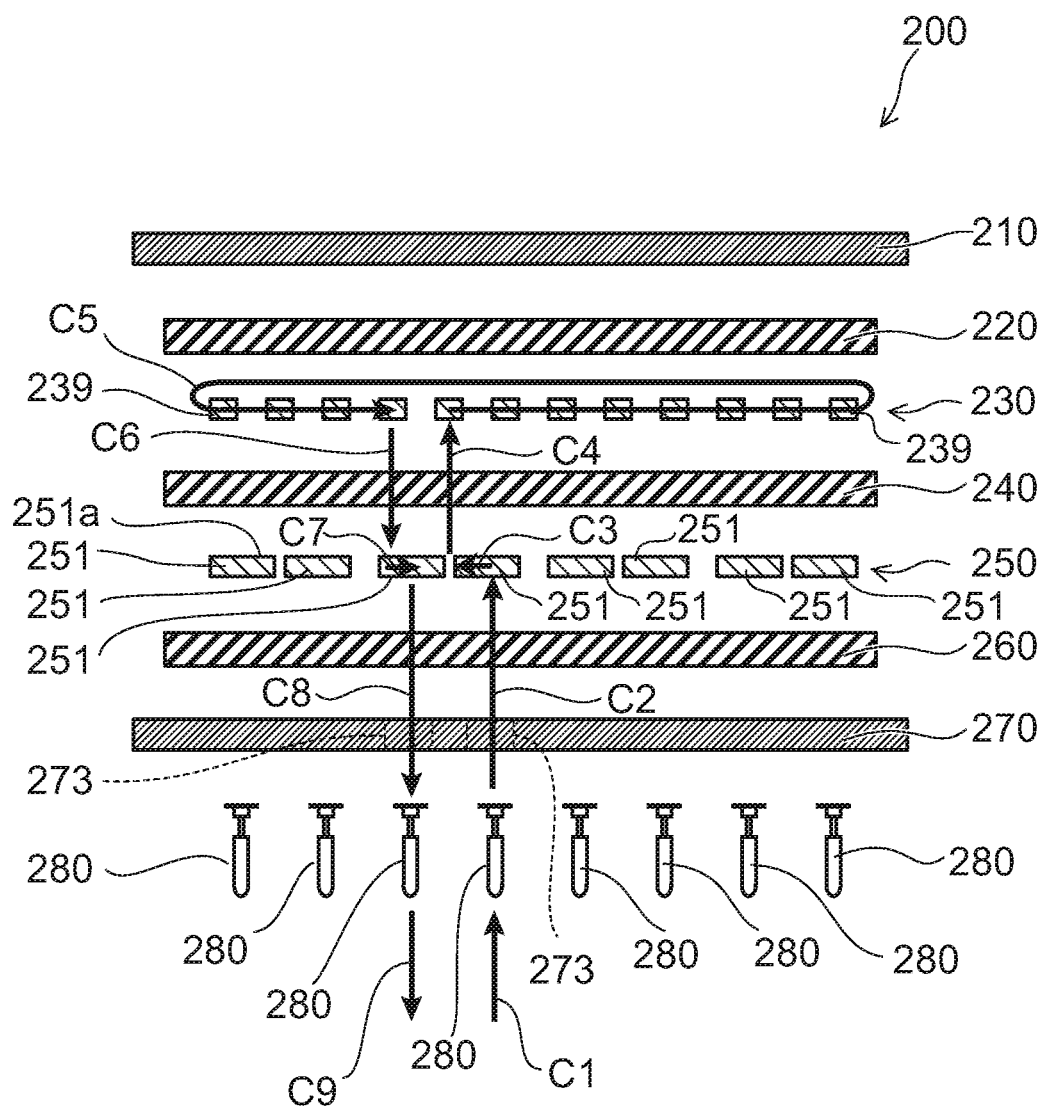
FIG. 5 is a schematic exploded view illustrating the heater plate of the embodiment.

FIG. 5 is a schematic exploded view illustrating the heater plate of the embodiment.

Figure 6:
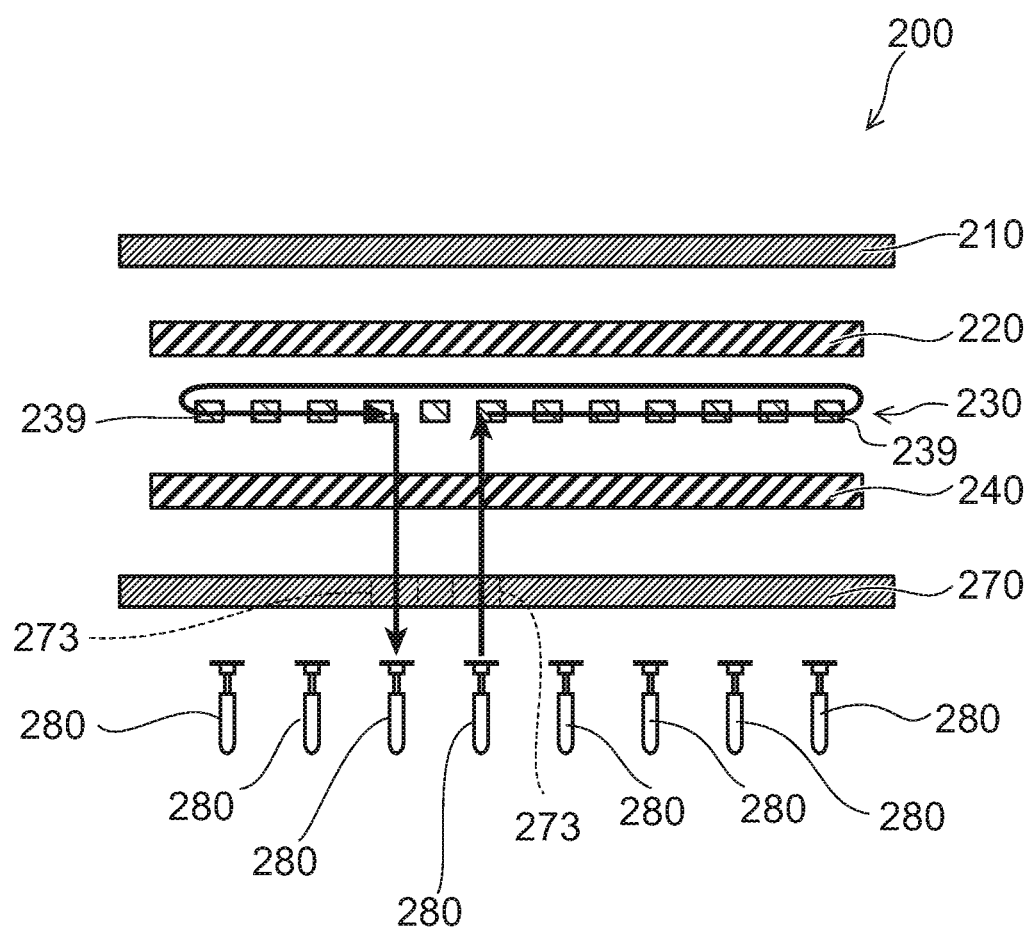
FIG. 6 is a schematic exploded view illustrating a modification of the heater plate of the embodiment.

FIG. 6 is a schematic exploded view illustrating a modification of the heater plate of the embodiment.

FIG. 3 is a schematic perspective view of the heater plate of the embodiment viewed from the upper surface (the surface on the ceramic dielectric substrate 100 side). FIG. 4A is a schematic perspective view of the heater plate of the embodiment viewed from the lower surface (the surface on the base plate 300 side). FIG. 4B is an enlarged schematic view of region B2 illustrated in FIG. 4A.

As illustrated in FIG. 5, the heater plate 200 of the embodiment includes a first support plate 210, a first resin layer 220, a heater element (a heating layer) 230, a second resin layer 240, a bypass layer 250, a third resin layer 260, a second support plate 270, and a power supply terminal 280. As illustrated in FIG. 3, a surface 211 (the upper surface) of the first support plate 210 forms the upper surface of the heater plate 200. As illustrated in FIGS. 4A and 4B, a surface 271 (the lower surface) of the second support plate 270 forms the lower surface of the heater plate 200. The first support plate 210 and the second support plate 270 are support plates that support the heater element 230, etc. In the example, the first support plate 210 and the second support plate 270 clamp and support the first resin layer 220, the heater element 230, the second resin layer 240, the bypass layer 250, and the third resin layer 260.

The first resin layer 220 is provided between the first support plate 210 and the second support plate 270. The heater element 230 is provided between the first resin layer 220 and the second support plate 270. The second resin layer 240 is provided between the heater element 230 and the second support plate 270. The bypass layer 250 is provided between the second resin layer 240 and the second support plate 270. The third resin layer 260 is provided between the bypass layer 250 and the second support plate 270.

As illustrated in FIG. 6, the bypass layer 250 and the third resin layer 260 may not always be provided. In the case where the bypass layer 250 and the third resin layer 260 are not provided, the second resin layer 240 is provided between the heater element 230 and the second support plate 270. In the description hereinbelow, the case where the heater plate 200 includes the bypass layer 250 and the third resin layer 260 is used as an example.

The first support plate 210 has a relatively high thermal conductivity. For example, a metal that includes at least one of aluminum, copper, or nickel, graphite that has a multi-layered structure, etc., are examples of the material of the first support plate 210. Aluminum or an aluminum alloy is suitable as the material of the first support plate 210 from the perspective of the magnetic properties and the contamination of the chamber and from the perspective of realizing both "high throughput" and "in-plane temperature uniformity of the processing object" which generally have an antinomic relationship. The thickness (the length in the Z-direction) of the first support plate 210 is, for example, not less than about 0.1 mm and not more than about 3.0 mm. More favorably, the thickness of the first support plate 210 is, for example, not less than about 0.3 mm and not more than about 1.0 mm. The first support plate 210 increases the uniformity of the temperature distribution in the plane of the heater plate 200. The first support plate 210 suppresses the warp of the heater plate 200. The first support plate 210 increases the strength of the bond between the heater plate 200 and the ceramic dielectric substrate 100.

An RF (Radio Frequency) voltage (high frequency voltage) is applied in the processing process of the processing object W. When the high frequency voltage is applied, the heater element 230 may generate heat due to the effects of the high frequency waves. Thereby, the temperature controllability of the heater element 230 degrades.

Conversely, in the embodiment, the first support plate 210 shields the heater element 230 and the bypass layer 250 from the high frequency waves. Thereby, the first support plate 210 can suppress the abnormal temperature heat generation of the heater element 230.

The material, thickness, and function of the second support plate 270 may be set freely according to the desired performance, dimensions, etc. For example, the material, thickness, and function of the second support plate 270 may be respectively the same as the material, thickness, and function of the first support plate 210. The first support plate 210 is electrically coupled to the second support plate 270. Here, in this specification, contact is within the scope of "coupled." Details of the electrical coupling between the second support plate 270 and the first support plate 210 are described below.

Thus, the first support plate 210 and the second support plate 270 have relatively high thermal conductivities. Thereby, the first support plate 210 and the second support plate 270 improve the thermal diffusion of the heat supplied from the heater element 230. By providing the first support plate 210 and the second support plate 270 with appropriate thicknesses and rigidities, for example, the warp of the heater plate 200 is suppressed. For example, the first support plate 210 and the second support plate 270 improve the shielding performance for the RF voltage applied to the electrodes of the wafer processing apparatus, etc. For example, the effects of the RF voltage on the heater element 230 are suppressed. Thus, the first support plate 210 and the second support plate 270 have the function of thermal diffusion, the function of warp suppression, and the function of shielding from the RF voltage.

For example, polyimide, polyamide-imide, etc., are examples of the material of the first resin layer 220. The thickness (the length in the Z-direction) of the first resin layer 220 is, for example, not less than about 0.01 mm and not more than about 0.20 mm. The first resin layer 220 couples the first support plate 210 and the heater element 230 to each other. The first resin layer 220 electrically insulates between the first support plate 210 and the heater element 230. Thus, the first resin layer 220 has the function of electric insulation and the function of surface coupling.

The material and thickness of the second resin layer 240 are respectively about the same as the material and thickness of the first resin layer 220. The material and thickness of the third resin layer 260 are respectively about the same as the material and thickness of the first resin layer 220.

The second resin layer 240 couples the heater element 230 and the bypass layer 250 to each other. The second resin layer 240 electrically insulates between the heater element 230 and the bypass layer 250. Thus, the second resin layer 240 has the function of electric insulation and the function of surface coupling.

The third resin layer 260 couples the bypass layer 250 and the second support plate 270 to each other. The third resin layer 260 electrically insulates between the bypass layer 250 and the second support plate 270. Thus, the third resin layer 260 has the function of electric insulation and the function of surface coupling.

For example, a metal that includes at least one of stainless steel, titanium, chrome, nickel, copper, or aluminum or the like is an example of the material of the heater element 230. The thickness (the length in the Z-direction) of the heater element 230 is, for example, not less than about 0.01 mm and not more than about 0.20 mm. The heater element 230 is electrically coupled to the bypass layer 250. On the other hand, the heater element 230 is electrically insulated from the first support plate 210 and the second support plate 270. The details of the electrical coupling between the heater element 230 and the bypass layer 250 are described below.

The heater element 230 generates heat when a current flows, and controls the temperature of the processing object W. For example, the heater element 230 heats the processing object W to a prescribed temperature. For example, the heater element 230 causes the temperature distribution in the plane of the processing object W to be uniform. For example, the heater element 230 deliberately provides a difference of the temperature in the plane of the processing object W.

The bypass layer 250 is arranged to be substantially parallel to the first support plate 210 and arranged to be substantially parallel to the second support plate 270. The bypass layer 250 includes multiple bypass portions 251. The bypass layer 250 includes, for example, eight bypass portions 251. The number of the bypass portions 251 is not limited to eight. The bypass layer 250 has a plate configuration. Conversely, the heater element 230 includes a heater electrode 239 having a band configuration. When viewed perpendicularly to the surface of the bypass layer 250 (surfaces 251a of the bypass portions 251), the surface area of the bypass layer 250 is greater than the surface area of the heater element 230 (the surface area of the heater electrode 239). The details are described below.

The bypass layer 250 is electrically conductive. The bypass layer 250 is electrically insulated from the first support plate 210 and the second support plate 270. For example, a metal that includes stainless steel or the like is an example of the material of the bypass layer 250. The thickness (the length in the Z-direction) of the bypass layer 250 is, for example, not less than about 0.03 mm and not more than about 0.30 mm. The thickness of the bypass layer 250 is thicker than the thickness of the first resin layer 220. The thickness of the bypass layer 250 is thicker than the thickness of the second resin layer 240. The thickness of the bypass layer 250 is thicker than the thickness of the third resin layer 260.

For example, the material of the bypass layer 250 is the same as the material of the heater element 230. On the other hand, the thickness of the bypass layer 250 is thicker than the thickness of the heater element 230. Therefore, the electrical resistance of the bypass layer 250 is lower than the electrical resistance of the heater element 230. Thereby, even in the case where the material of the bypass layer 250 is the same as the material of the heater element 230, heat generation by the bypass layer 250 that is similar to that of the heater element 230 can be suppressed. That is, the electrical resistance of the bypass layer 250 can be suppressed; and the heat generation amount of the bypass layer 250 can be suppressed. The method for suppressing the electrical resistance of the bypass layer 250 and suppressing the heat generation amount of the bypass layer 250 may be realized not by setting the thickness of the bypass layer 250 but by using a material having a relatively low volume resistivity. In other words, the material of the bypass layer 250 may be different from the material of the heater element 230. For example, a metal that includes at least one of stainless steel, titanium, chrome, nickel, copper, or aluminum or the like is an example of the material of the bypass layer 250.

The power supply terminal 280 is electrically coupled to the bypass layer 250. The power supply terminal 280 is provided from the heater plate 200 toward the base plate 300 in the state in which the heater plate 200 is provided between the base plate 300 and the ceramic dielectric substrate 100. The power supply terminal 280 supplies, via the bypass layer 250 to the heater element 230, electrical power supplied from outside the electrostatic chuck 10. For example, the power supply terminal 280 may be connected directly to the heater element 230. Thereby, the bypass layer 250 is omissible.

The heater plate 200 includes the multiple power supply terminals 280. The heater plate 200 illustrated in FIG. 3 to FIG. 5 includes eight power supply terminals 280. The number of the power supply terminals 280 is not limited to eight. One power supply terminal 280 is electrically coupled to one bypass portion 251. Holes 273 pierce the second support plate 270. The power supply terminals 280 are electrically coupled to the bypass portions 251 by passing through the holes 273.

As illustrated by arrow C1 and arrow C2 illustrated in FIG. 5, when the electrical power is supplied to the power supply terminals 280 from outside the electrostatic chuck 10, the current flows from the power supply terminals 280 toward the bypass layer 250. As illustrated by arrow C3 and arrow C4 illustrated in FIG. 5, the current that flows toward the bypass layer 250 flows from the bypass layer 250 toward the heater element 230. As illustrated by arrow C5 and arrow C6 illustrated in FIG. 5, the current that flows toward the heater element 230 flows through a prescribed zone (region) of the heater element 230 and flows from the heater element 230 toward the bypass layer 250. The details of the zone of the heater element 230 are described below. As illustrated by arrow C7 and arrow C8 illustrated in FIG. 5, the current that flows toward the bypass layer 250 flows from the bypass layer 250 toward the power supply terminals 280. As illustrated by arrow C9 illustrated in FIG. 5, the current that flows toward the power supply terminals 280 flows outside the electrostatic chuck 10.

Thus, in the coupling portions between the heater element 230 and the bypass layer 250, a portion where the current enters the heater element 230 exists; and a portion where the current exits from the heater element 230 exists. That is, a pair of coupling portions between the heater element 230 and the bypass layer 250 exists. Because the heater plate 200 illustrated in FIG. 3 to FIG. 5 includes eight power supply terminals 280, four pairs of coupling portions exist between the heater element 230 and the bypass layer 250.

According to the embodiment, the heater element 230 is provided between the first support plate 210 and the second support plate 270. Thereby, the uniformity of the temperature distribution in the plane of the heater plate 200 can be improved; and the uniformity of the temperature distribution in the plane of the processing object W can be increased. The first support plate 210 and the second support plate 270 shield the heater element 230 and the bypass layer 250 from the high frequency waves; and the abnormal temperature heat generation of the heater element 230 can be suppressed.

As described above, the bypass layer 250 is provided between the heater element 230 and the second support plate 270. That is, the bypass layer 250 is provided between the heater element 230 and the base plate 300. The thermal conductivity of stainless steel is lower than the thermal conductivity of aluminum and the thermal conductivity of copper. Therefore, the bypass layer 250 suppresses the transfer into the second support plate 270 of the heat supplied from the heater element 230. That is, the bypass layer 250 has a thermal insulation effect for the second support plate 270 side when viewed from the bypass layer 250; and the uniformity of the temperature distribution in the plane of the processing object W can be increased.

The bypass layer 250 can provide more degrees of freedom for the arrangement of the power supply terminals 280.

By providing the bypass layer 250, compared to the case where the bypass layer 250 is not provided, the power supply terminals that have large thermal capacities may not be directly coupled to the heater element 230. Thereby, the uniformity of the temperature distribution in the plane of the processing object W can be increased. Also, compared to the case where the bypass layer 250 is not provided, the power supply terminals 280 may not be coupled to the heater element 230 which is thin. Thereby, the reliability of the heater plate 200 can be increased.

As described above, the power supply terminal 280 is provided from the heater plate 200 toward the base plate 300. Therefore, the electrical power can be supplied to the power supply terminal 280 via a member called a socket, etc., from a lower surface 303 (referring to FIG. 2A and FIG. 2B) side of the base plate 300. Thereby, the wiring of the heater is realized while suppressing the exposure of the power supply terminal 280 inside the chamber where the electrostatic chuck 10 is mounted.

A method for manufacturing the heater plate 200 of the embodiment will now be described with reference to the drawings.

Figure 7A:
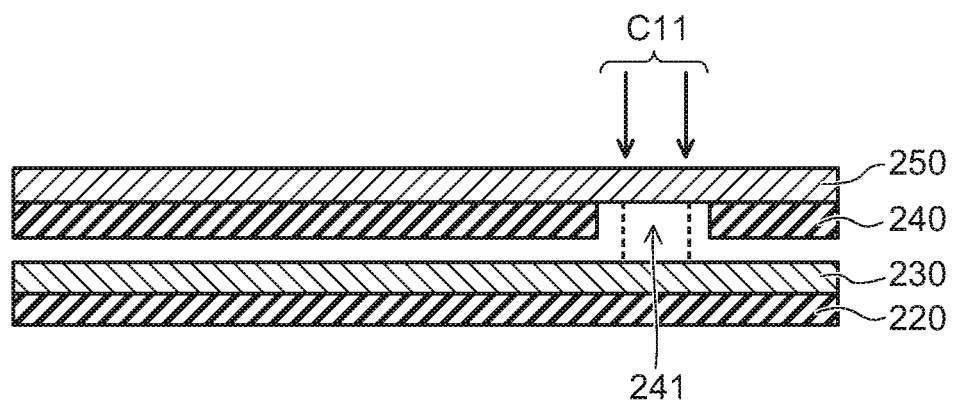
FIGS. 7A and 7B are schematic cross-sectional views illustrating an example of the manufacturing method of the embodiment.
Figure 7B:
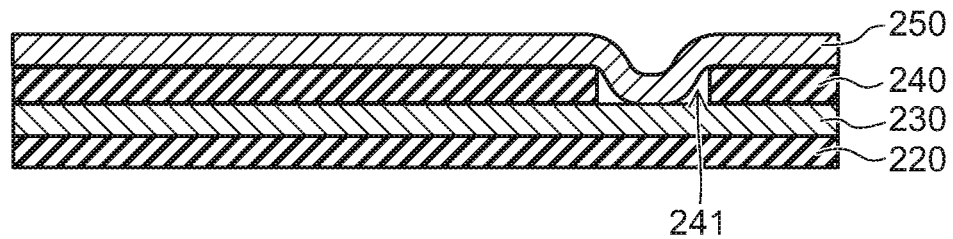

FIGS. 7A and 7B are schematic cross-sectional views illustrating an example of the manufacturing method of the embodiment.

Figure 8:
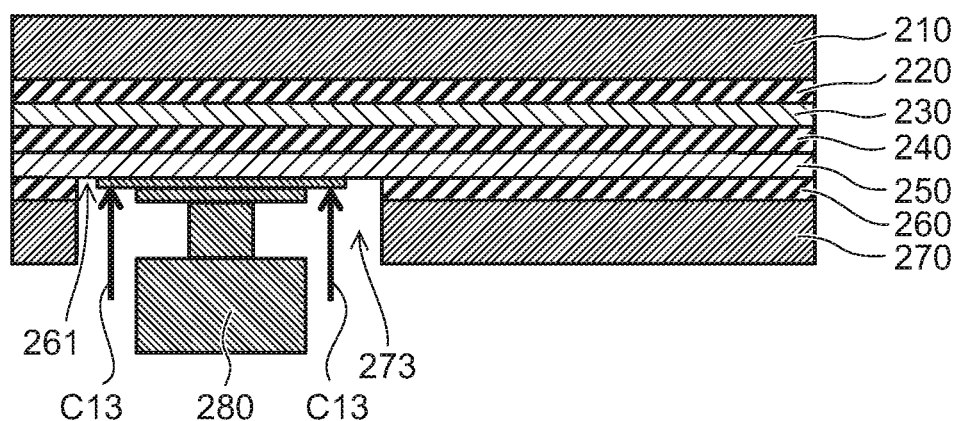
FIG. 8 is a schematic cross-sectional view illustrating another example of the manufacturing method of the embodiment.

FIG. 8 is a schematic cross-sectional view illustrating another example of the manufacturing method of the embodiment.

FIG. 7A is a schematic cross-sectional view illustrating the state prior to coupling the bypass layer and the heater element. FIG. 7B is a schematic cross-sectional view illustrating the state after coupling the bypass layer and the heater element. FIG. 8 is a schematic cross-sectional view illustrating an example of the coupling process between the bypass layer and the power supply terminal.

In the method for manufacturing the electrostatic chuck 10 according to the embodiment, for example, first, the first support plate 210 and the second support plate 270 are manufactured by machining aluminum. The inspections of the first support plate 210 and the second support plate 270 are performed using, for example, a three-dimensional measuring instrument, etc.

Then, the first resin layer 220, the second resin layer 240, and the third resin layer 260 are manufactured by, for example, cutting a polyimide film using a laser, machining, punching, melting, etc. The inspections of the first resin layer 220, the second resin layer 240, and the third resin layer 260 are performed using, for example, the naked eye, etc.

Then, a heater pattern is formed by cutting stainless steel using etching utilizing photolithography technology and/or printing technology, machining, punching, etc. Thereby, the heater element 230 is manufactured. The measurement of the resistance value of the heater element 230 and the like also are performed.

Continuing as illustrated in FIG. 7A and FIG. 7B, the coupling between the heater element 230 and the bypass layer 250 is performed. The coupling between the heater element 230 and the bypass layer 250 is performed by soldering, brazing, welding, contacting, etc. As illustrated in FIG. 7A, a hole 241 is provided in the second resin layer 240. The hole 241 pierces the second resin layer 240. For example, as illustrated by arrow C11 illustrated in FIG. 7A, the heater element 230 and the bypass layer 250 are coupled by spot welding from the bypass layer 250 side.

The coupling between the heater element 230 and the bypass layer 250 is not limited to welding. For example, the coupling between the heater element 230 and the bypass layer 250 may be performed by coupling utilizing a laser beam, soldering, brazing, contacting, etc.

Continuing, the members of the heater plate 200 are stacked and pressed using a hot pressing machine.

Continuing as illustrated in FIG. 8, the coupling between the power supply terminal 280 and the bypass layer 250 is performed. The coupling between the power supply terminal 280 and the bypass layer 250 is performed by welding, a laser, soldering, brazing, etc. As illustrated in FIG. 8, the hole 273 is provided in the second support plate 270. The hole 273 pierces the second support plate 270. This is as described above in reference to FIG. 4B. A hole 261 is provided in the third resin layer 260. The hole 261 pierces the third resin layer 260. As illustrated by arrow C13 illustrated in FIG. 8, the power supply terminal 280 and the bypass layer 250 are coupled by welding, a laser, soldering, brazing, etc., from the second support plate 270 toward the first support plate 210.

Thus, the heater plate 200 of the embodiment is manufactured.

Inspections of the heater plate 200 and the like are performed as appropriate after the manufacturing.

Figure 9:
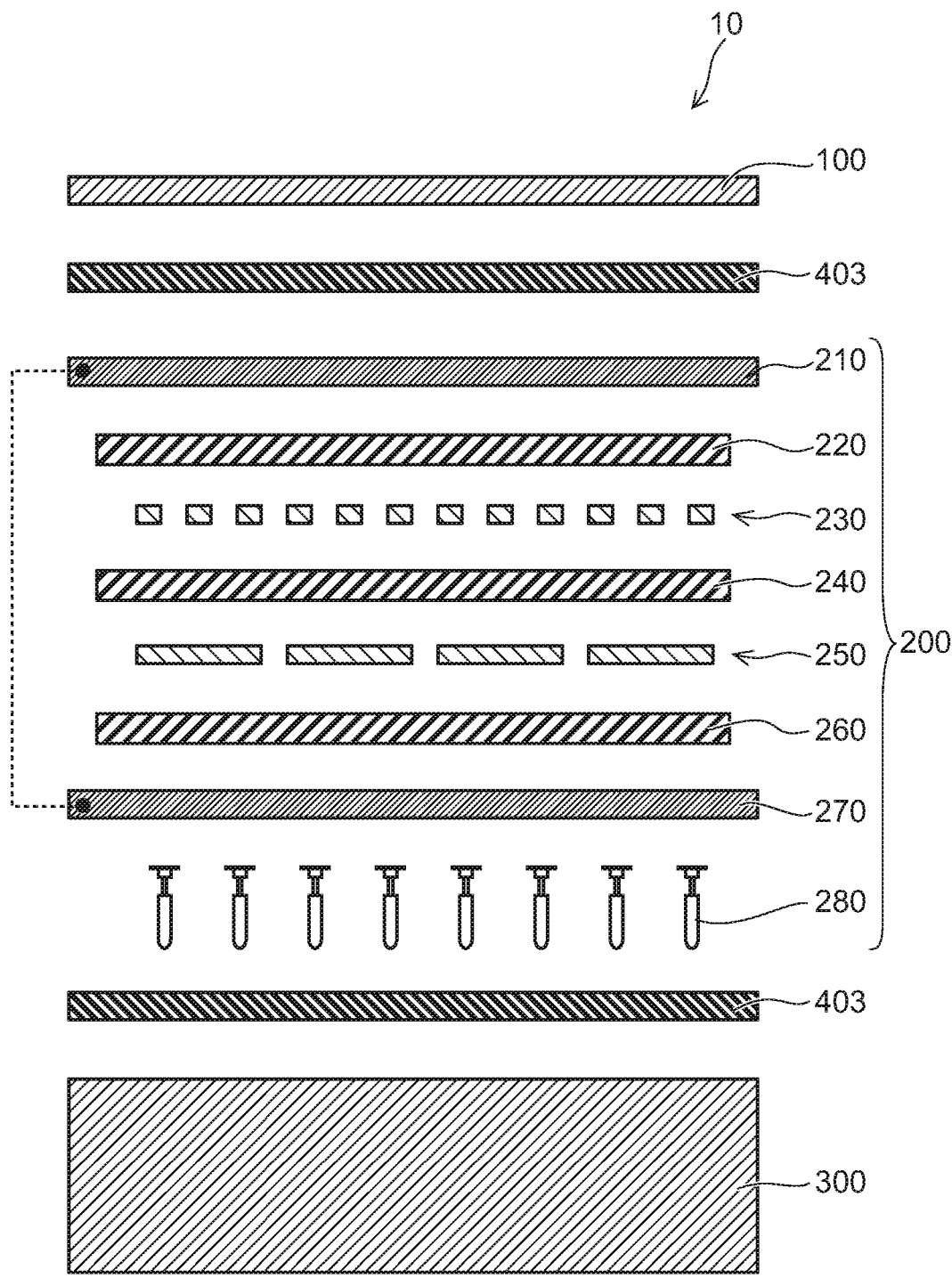
FIG. 9 is a schematic exploded view illustrating the electrostatic chuck according to the embodiment.

FIG. 9 is a schematic exploded view illustrating the electrostatic chuck according to the embodiment.

Figure 10A:
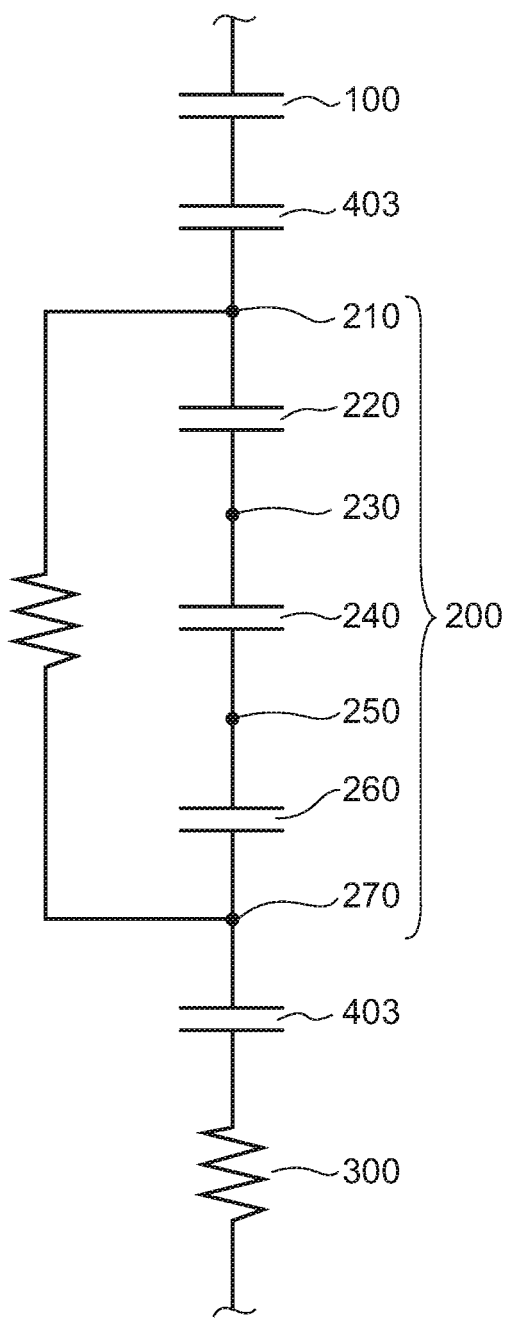
FIGS. 10A and 10B are electronic circuit diagrams illustrating the electrostatic chuck.

FIG. 10A is an electronic circuit diagram illustrating the electrostatic chuck according to the embodiment.

Figure 10B:
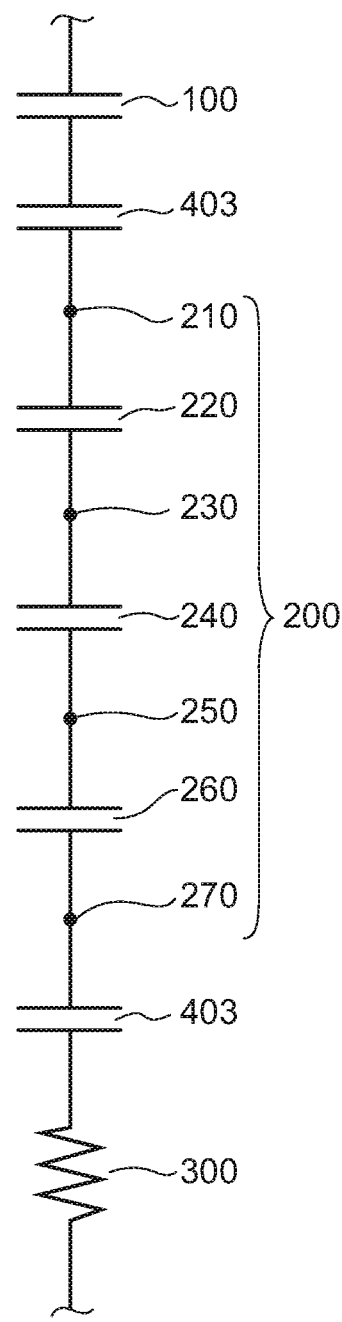

FIG. 10A is an electronic circuit diagram illustrating an example in which the first support plate and the second support plate are coupled electrically. FIG. 10B is an electronic circuit diagram illustrating an example in which the first support plate and the second support plate are not coupled electrically.

As illustrated in FIG. 9 and FIG. 10A, the first support plate 210 is electrically coupled to the second support plate 270. The coupling between the first support plate 210 and the second support plate 270 is performed by, for example, welding, coupling utilizing a laser beam, soldering, contacting, etc.

For example, as illustrated in FIG. 10B, if the first support plate 210 is not electrically connected reliably to the second support plate 270, the first support plate 210 may fluctuate between being electrically connected and not being electrically coupled to the second support plate 270. Then, fluctuation of the etching rate may occur when the plasma is generated. Even if the first support plate 210 is not electrically coupled to the second support plate 270, when the plasma is generated, a current may flow in the heater element 230; and the heater element 230 may generate heat. In other words, if the first support plate 210 is not electrically connected reliably to the second support plate 270, the heater element 230 may generate heat due to a current other than the heater current.

Conversely, in the electrostatic chuck 10 according to the embodiment as illustrated in FIG. 10A, the first support plate 210 is electrically coupled to the second support plate 270. Thereby, the occurrence of the fluctuation of the etching rate when the plasma is generated due to the current flowing from the first support plate 210 toward the second support plate 270 or the current flowing from the second support plate 270 toward the first support plate 210 can be suppressed. The heat generation of the heater element 230 due to the current other than the heater current can be suppressed.

The heater element 230 and the bypass layer 250 can be shielded from the high frequency waves. Thereby, the abnormal temperature heat generation of the heater element 230 can be suppressed. The impedance of the heater plate 200 can be suppressed.

Specific examples of the heater plate 200 of the embodiment will now be described with reference to the drawings.

Figure 11A:
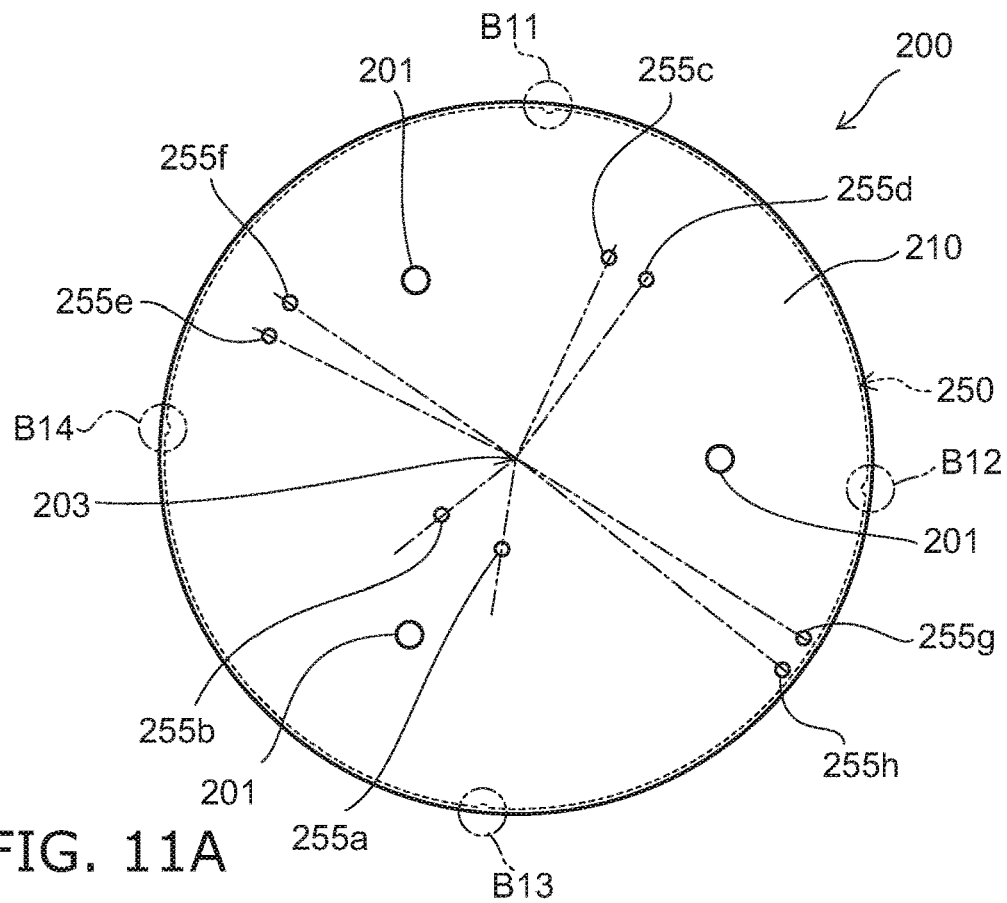
FIGS. 11A and 11B are schematic plan views illustrating a specific example of the heater plate of the embodiment.
Figure 11B:
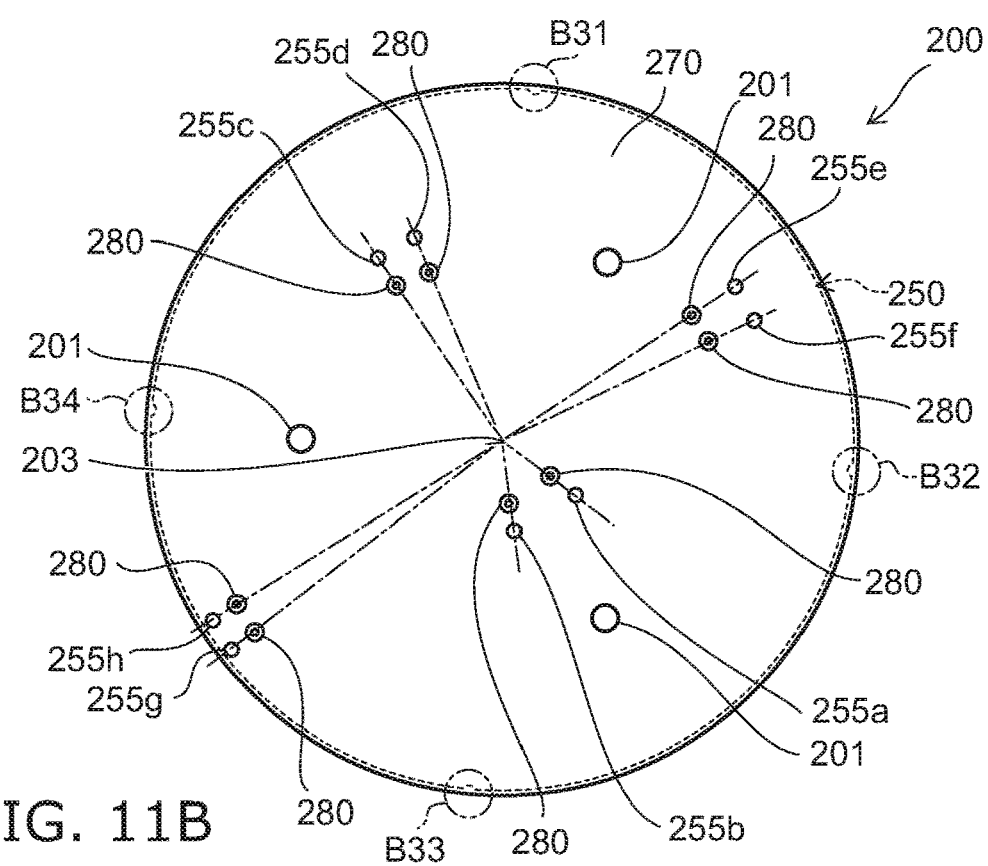

FIGS. 11A and 11B are schematic plan views illustrating a specific example of the heater plate of the embodiment.

Figure 12A:
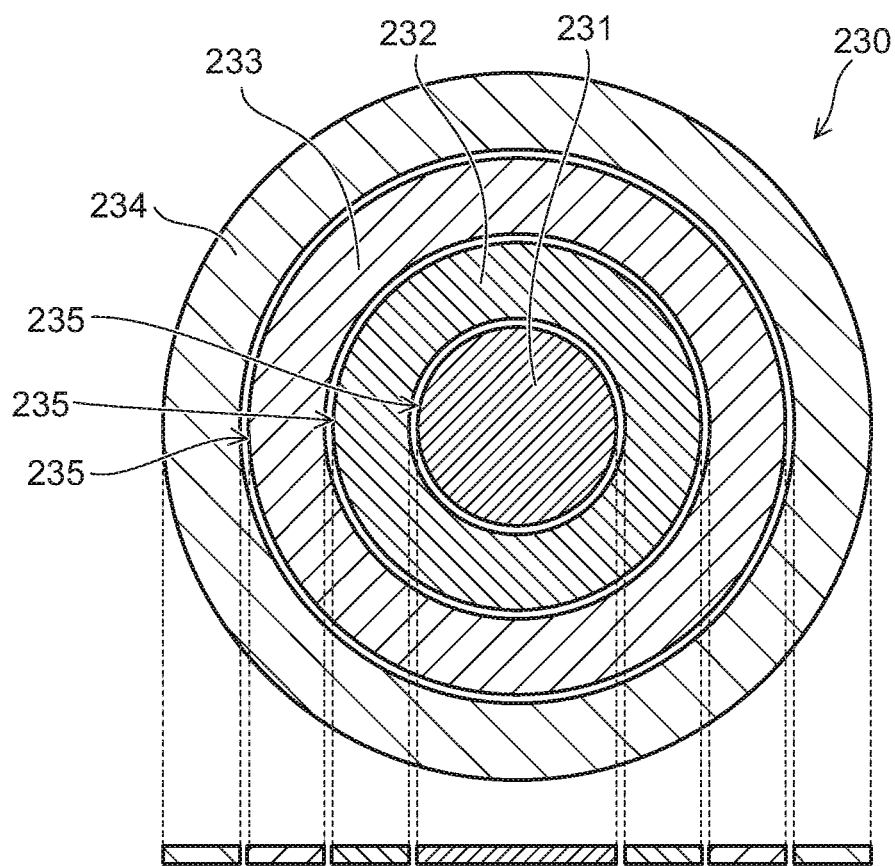
FIGS. 12A and 12B are schematic plan views illustrating heater elements of this specific example.
Figure 12B:
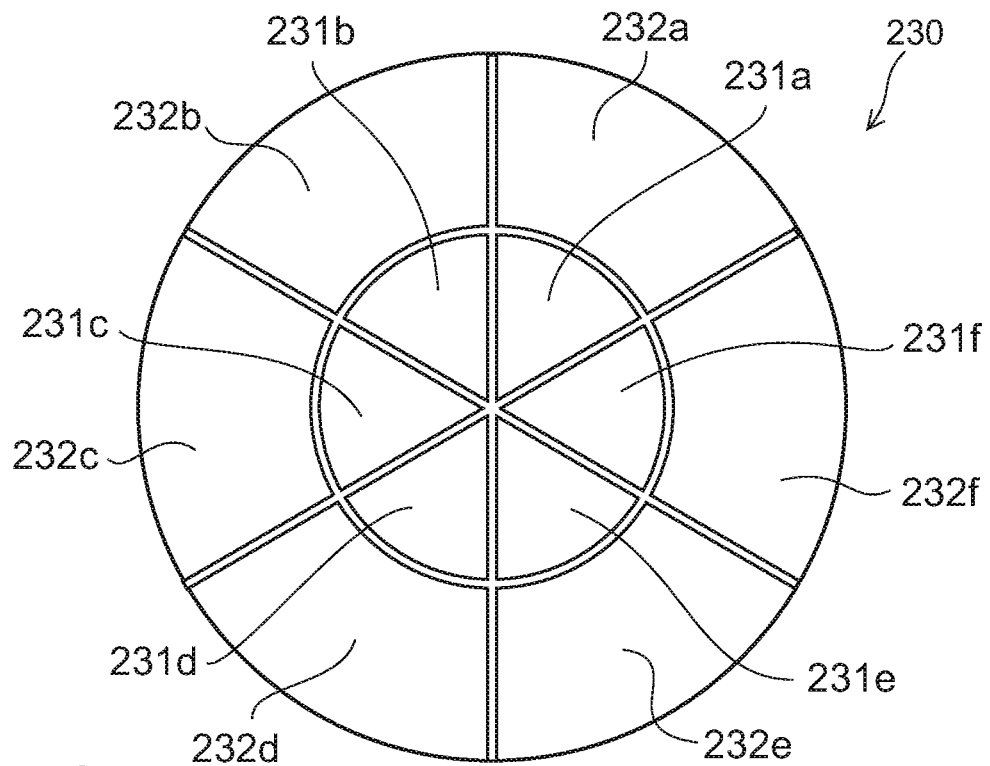
Figure 13:
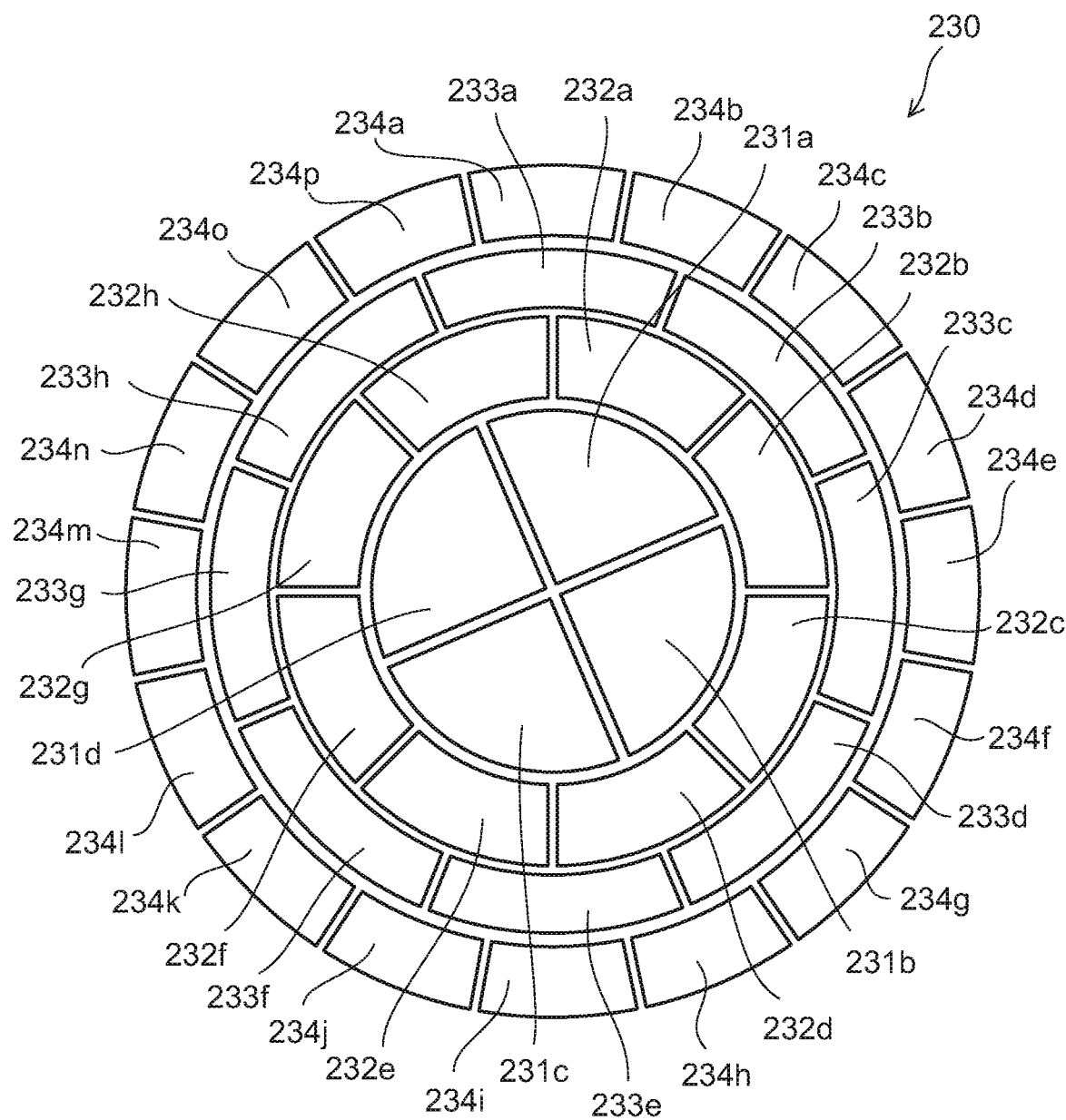
FIG. 13 is a schematic plan view illustrating heater elements of this specific example.

FIGS. 12A, 12B, and 13 are schematic plan views illustrating heater elements of this specific example.

Figure 14A:
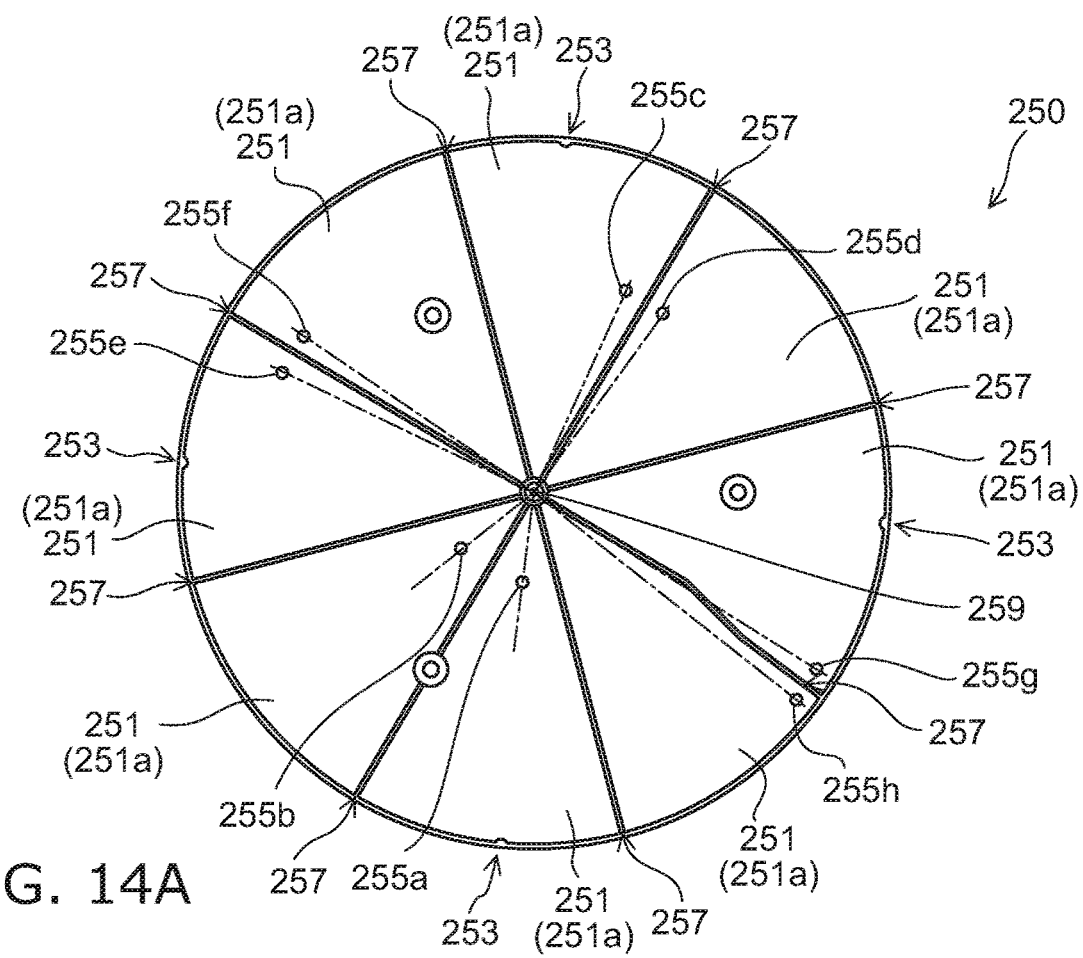
FIGS. 14A and 14B are schematic plan views illustrating bypass layers of this specific example.
Figure 14B:
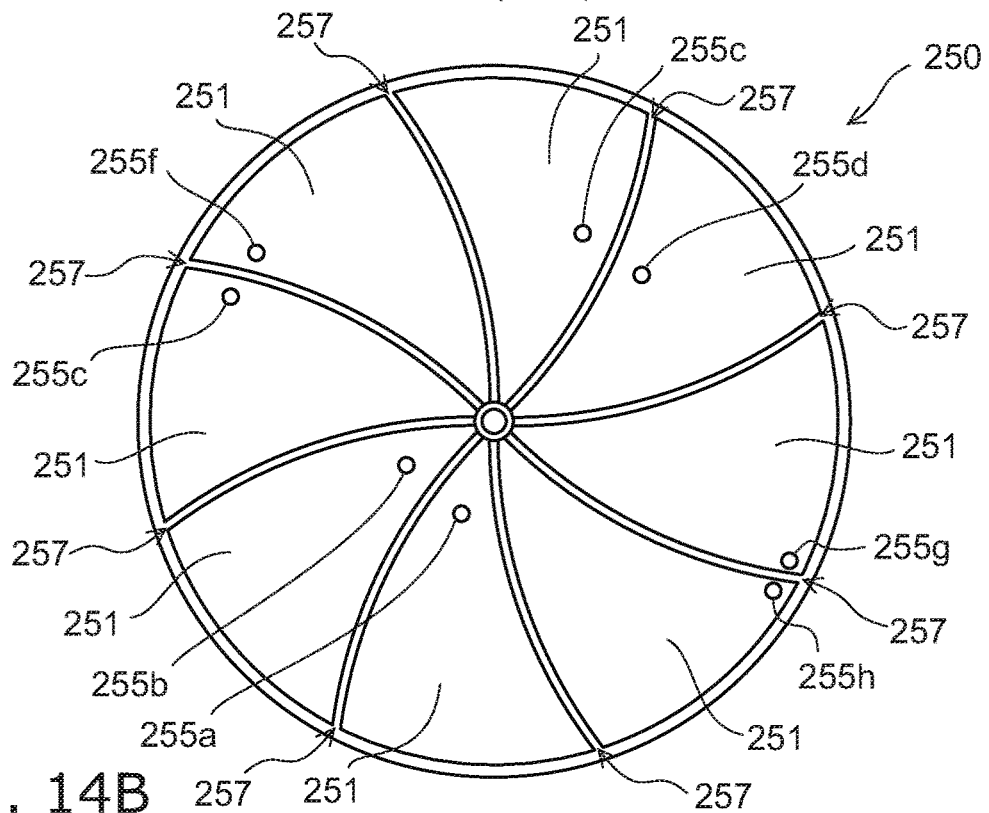

FIGS. 14A and 14B are schematic plan views illustrating bypass layers of this specific example.

Figure 15A:
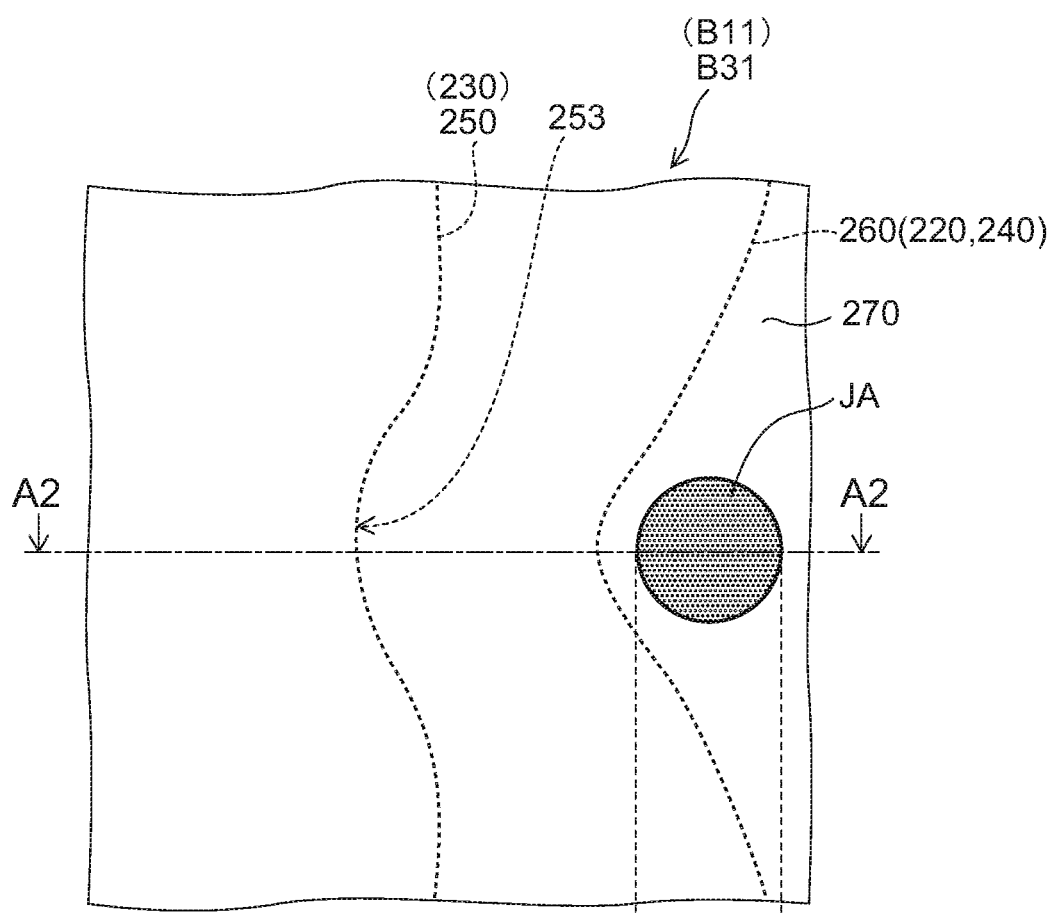
FIGS. 15A and 15B are an enlarged views schematically illustrating a portion of the heater plate of this specific example.
Figure 15B:
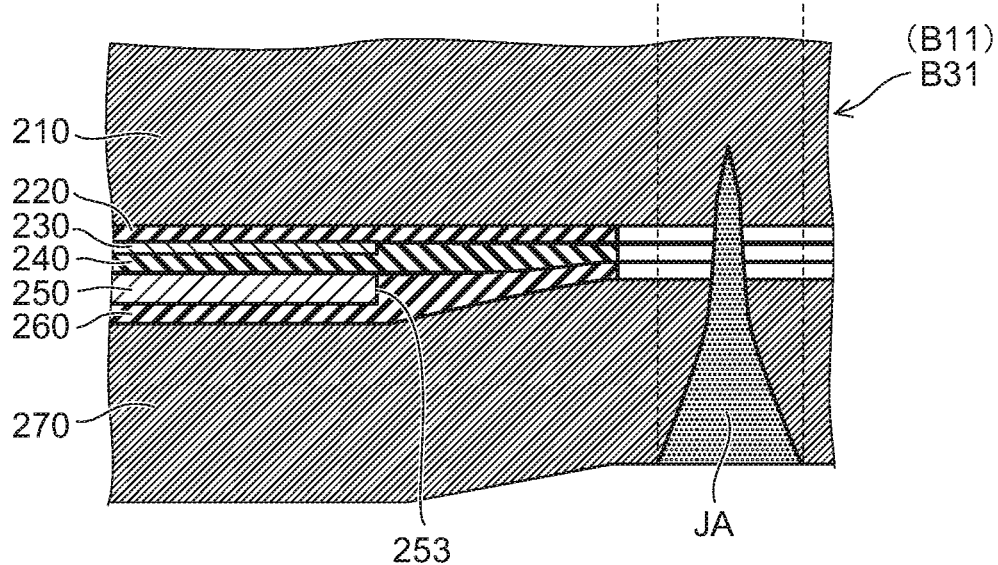

FIGS. 15A and 15B are an enlarged views schematically illustrating a portion of the heater plate of this specific example.

FIG. 11A is a schematic plan view of the heater plate of this specific example viewed from the upper surface. FIG. 11B is a schematic plan view of the heater plate of this specific example viewed from the lower surface. FIG. 12A is a schematic plan view illustrating an example of the region of the heater element. FIG. 12B and FIG. 13 are schematic plan views illustrating other examples of the region of the heater element.

As illustrated in FIG. 14A, at least one of the multiple bypass portions 251 of the bypass layer 250 has a notch 253 in an edge portion. Four notches 253 are provided in the bypass layer 250 illustrated in FIG. 13. The number of the notches 253 is not limited four.

Because at least one of the multiple bypass layers 250 includes the notch 253, the second support plate 270 can contact the first support plate 210.

As illustrated in FIG. 11A and FIG. 11B, the first support plate 210 is electrically coupled to the second support plate 270 in regions B11 to B14 and regions B31 to B34. The regions B11 to B14 correspond respectively to the regions B31 to B34. That is, in the specific example illustrated in FIG. 11A to FIG. 13, the first support plate 210 is electrically coupled to the second support plate 270 in four regions and is not electrically coupled to the second support plate 270 in eight regions.

FIG. 15A and FIG. 15B are enlarged views illustrating an example of the region B31 (the region B11). FIG. 14A is a schematic plan view of the region B31; and FIG. 15B is a schematic cross-sectional view of the region B31. FIG. 15B schematically illustrates an A2-A2 cross section of FIG. 15A. The other regions B12 to B14 and regions B32 to B34 are similar to the regions B11 and B31; and a detailed description is therefore omitted.

As illustrated in FIG. 15A and FIG. 15B, a coupling region JA is provided in the region B31. The coupling region JA couples the first support plate 210 and the second support plate 270 to each other. The coupling region JA is provided at the outer edges of the first support plate 210 and the second support plate 270 to correspond to the notch 253 of the bypass layer 250. The coupling region JA is formed by, for example, laser welding from the second support plate 270 side. Thereby, the coupling region JA is formed in a spot configuration. The coupling region JA may be formed from the first support plate 210 side. The method for forming the coupling region JA is not limited to laser welding and may be another method. The configuration of the coupling region JA is not limited to a spot configuration and may be an elliptical configuration, a semicircular configuration, a polygonal configuration, etc.

The surface area of the coupling region JA where the first support plate 210 is coupled to the second support plate 270 is narrower than the surface area of the surface 211 of the first support plate 210 (referring to FIG. 3). The surface area of the coupling region JA is narrower than the surface area difference of the surface area of the heater element 230 subtracted from the surface area of the surface 211. In other words, the surface area of the coupling region JA is narrower than the surface area of the region of the first support plate 210 not overlapping the heater element 230 when projected onto a plane parallel to the surface 211. The surface area of the coupling region JA where the first support plate 210 is coupled to the second support plate 270 is narrower than the surface area of the surface 271 of the second support plate 270 (referring to FIG. 4A). The surface area of the coupling region JA is narrower than the surface area difference of the surface area of the heater element 230 subtracted from the surface area of the surface 271. In other words, the surface area of the coupling region JA is narrower than the surface area of the region of the second support plate 270 not overlapping the heater element 230 when projected onto a plane parallel to the surface 271.

The diameter of the coupling region JA formed in the spot configuration is, for example, 1 mm (not less than 0.5 mm and not more than 3 mm). On the other hand, the diameter of the first support plate 210 and the second support plate 270 is, for example, 300 mm. The diameter of the first support plate 210 and the second support plate 270 is set according to the processing object W to be held. Thus, the surface area of the coupling region JA is sufficiently small compared to the surface area of the surface 211 of the first support plate 210 and the surface area of the surface 271 of the second support plate 270. The surface area of the coupling region JA is, for example, not more than 1/5000 of the surface area of the surface 211 (the surface area of the surface 271). Here, more specifically, the surface area of the coupling region JA is the surface area when projected onto a plane parallel to the surface 211 of the first support plate 210. In other words, the surface area of the coupling region JA is the surface area when viewed in the top view.

In the example, four coupling regions JA that correspond to the regions B11 to B14 and the regions B31 to B34 are provided. The number of the coupling regions JA is not limited to four. The number of the coupling regions JA may be any number. For example, twelve coupling regions JA may be provided in the first support plate 210 and the second support plate 270 every 30°. The configuration of the coupling region JA is not limited to a spot configuration. The configuration of the coupling region JA may be an elliptical configuration, a polygonal configuration, a line configuration, etc. For example, the coupling region JA may be formed in an annular configuration along the outer edge of the first support plate 210 and the second support plate 270.

The second support plate 270 has the hole 273 (referring to FIG. 4B and FIG. 8). On the other hand, the first support plate 210 does not have a hole where the power supply terminal 280 passes through. Therefore, the surface area of the surface 211 of the first support plate 210 is greater than the surface area of the surface 271 of the second support plate 270.

The heater element 230 includes, for example, the heater electrode 239 having the band configuration. In the specific example illustrated in FIG. 12A, the heater electrode 239 is arranged to form substantially a circle. The heater electrode 239 is arranged in a first region 231, a second region 232, a third region 233, and a fourth region 234. The first region 231 is positioned at the central portion of the heater element 230. The second region 232 is positioned on the outer side of the first region 231. The third region 233 is positioned on the outer side of the second region 232. The fourth region 234 is positioned on the outer side of the third region 233.

The heater electrode 239 that is disposed in the first region 231 is not coupled electrically to the heater electrode 239 disposed in the second region 232. The heater electrode 239 that is disposed in the second region 232 is not coupled electrically to the heater electrode 239 disposed in the third region 233. The heater electrode 239 that is disposed in the third region 233 is not coupled electrically to the heater electrode 239 disposed in the fourth region 234. That is, the heater electrode 239 is provided in a state of being mutually-independent in multiple regions.

In the specific example illustrated in FIG. 12B, the heater electrode 239 is arranged to form at least a portion of a substantially fan-like shape. The heater electrode 239 is disposed in a first region 231a, a second region 231b, a third region 231c, a fourth region 231d, a fifth region 231e, a sixth region 231f, a seventh region 232a, an eighth region 232b, a ninth region 232c, a tenth region 232d, an eleventh region 232e, and a twelfth region 232f. The heater electrode 239 that is disposed in any region is not coupled electrically to the heater electrode 239 disposed in the other regions. That is, the heater electrode 239 is provided in a state of being mutually-independent in multiple regions. As illustrated in FIG. 12A and FIG. 12B, the regions where the heater electrode 239 is disposed are not particularly limited.

In the specific example illustrated in FIG. 13, the heater element 230 further includes many regions. In the heater element 230 of FIG. 13, the first region 231 shown in FIG. 12A is further subdivided into four regions 231a to 231d. The second region 232 shown in FIG. 12A is further subdivided into eight regions 232a to 232h. The third region 233 shown in FIG. 12A is further subdivided into eight regions 233a to 233h. The fourth region 234 shown in FIG. 12A is further subdivided into sixteen regions 234a to 234p. Thus, the number and configurations of the regions of the heater element 230 where the heater electrode 239 is disposed may be arbitrary.

As illustrated in FIG. 14A, the bypass portions 251 of the bypass layer 250 have a fan-like shape. The bypass portions 251 of the multiple fan-like shapes are arranged to be separated from each other; and the bypass layer 250 has a substantially circular shape as an entirety. As illustrated in FIG. 14A, a separating portion 257 between the mutually-adjacent bypass portions 251 extends in the diametrical direction from a center 259 of the bypass layer 250. In other words, the separating portion 257 between the mutually-adjacent bypass portions 251 extends in a radial configuration from the center 259 of the bypass layer 250. The surface area of the surface 251a of the bypass portion 251 is greater than the surface area of the separating portion 257. The surface area of the bypass layer 250 (the surface area of the surface 251a of the bypass portion 251) is greater than the surface area of the heater element 230 (the surface area of the heater electrode 239).

As illustrated in FIG. 14B, the configuration of the multiple bypass portions 251 of the bypass layer 250 may be, for example, a curved fan-like configuration. Thus, the number and configurations of the multiple bypass portions 251 provided in the bypass layer 250 may be arbitrary.

In the description hereinbelow relating to FIG. 11A to FIG. 14B, the region of the heater element 230 illustrated in FIG. 12A is used as an example. The heater electrode 239 is arranged to form substantially a circle; and the bypass portions 251 that have the multiple fan-like shapes are arranged to be separated from each other. Therefore, when viewed perpendicularly to the surfaces 251a of the bypass portions 251, the heater electrode 239 crosses the separating portion 257 between the mutually-adjacent bypass portions 251. When viewed perpendicularly to the surfaces 251a of the bypass portions 251, a separating portion 235 between the regions (the first region 231, the second region 232, the third region 233, and the fourth region 234) of the mutually-adjacent heater elements 230 crosses the separating portion 257 between the mutually-adjacent bypass portions 251.

As illustrated in FIG. 11A and FIG. 11B, the multiple imaginary lines connecting a center 203 of the heater plate 200 to each of the coupling portions 255a to 255h between the heater element 230 and the bypass layer 250 do not overlap each other. In other words, the coupling portions 255a to 255h between the heater element 230 and the bypass layer 250 are arranged in mutually-different directions when viewed from the center 203 of the heater plate 200. As illustrated in FIG. 11B, the power supply terminal 280 exists on an imaginary line connecting the center 203 of the heater plate 200 to each of the coupling portions 255a to 255h.

The coupling portions 255a and 255b are portions coupling the bypass layer 250 and the heater electrode 239 disposed in the first region 231. The coupling portions 255a and 255b correspond to the first region 231. One of the coupling portion 255a or the coupling portion 255b is a portion where the current enters the heater element 230. The other of the coupling portion 255a or the coupling portion 255b is a portion where the current exits from the heater element 230.

The coupling portions 255c and 255d are portions coupling the bypass layer 250 and the heater electrode 239 disposed in the second region 232. The coupling portions 255c and 255d correspond to the second region 232. One of the coupling portion 255c or the coupling portion 255d is a portion where the current enters the heater element 230. The other of the coupling portion 255c or the coupling portion 255d is a portion where the current exits from the heater element 230.

The coupling portions 255e and 255f are portions coupling the bypass layer 250 and the heater electrode 239 disposed in the third region 233. The coupling portions 255e and 255f correspond to the third region 233. One of the coupling portion 255e or the coupling portion 255f is a portion where the current enters the heater element 230. The other of the coupling portion 255e or the coupling portion 255f is a portion where the current exits from the heater element 230.

The coupling portions 255g and 255h are portions coupling the bypass layer 250 and the heater electrode 239 disposed in the fourth region 234. The coupling portions 255g and 255h correspond to the fourth region 234. One of the coupling portion 255g or the coupling portion 255h is a portion where the current enters the heater element 230. The other of the coupling portion 255g or the coupling portion 255h is a portion where the current exits from the heater element 230.

The coupling portions 255a and 255b exist on a circle that has the center 203 of the heater plate 200 as a center and is different from the circle passing through the coupling portions 255c and 255d. The coupling portions 255a and 255b exist on a circle that has the center 203 of the heater plate 200 as a center and is different from the circle passing through the coupling portions 255e and 255f. The coupling portions 255a and 255b exist on a circle that has the center 203 of the heater plate 200 as a center and is different from the circle passing through the coupling portions 255g and 255h.

The coupling portions 255c and 255d exist on a circle that has the center 203 of the heater plate 200 as a center and is different from the circle passing through the coupling portions 255e and 255f. The coupling portions 255c and 255d exist on a circle that has the center 203 of the heater plate 200 as a center and is different from the circle passing through the coupling portions 255g and 255h.

The coupling portions 255e and 255f exist on a circle that has the center 203 of the heater plate 200 as a center and is different from the circle passing through the coupling portions 255g and 255h.

As illustrated in FIG. 11A and FIG. 11B, the heater plate 200 has a lift pin hole 201. In the specific example illustrated in FIG. 11A and FIG. 11B, the heater plate 200 has three lift pin holes 201. The number of the lift pin holes 201 is not limited to three. The power supply terminal 280 is provided in a region on the center 203 side of the heater plate 200 when viewed from the lift pin hole 201.

According to this specific example, because the heater electrode 239 is disposed in the multiple regions, the temperature in the plane of the processing object W can be controlled independently for each region. Thereby, a difference of the temperature in the plane of the processing object W can be provided deliberately (temperature controllability).

Figure 16A:
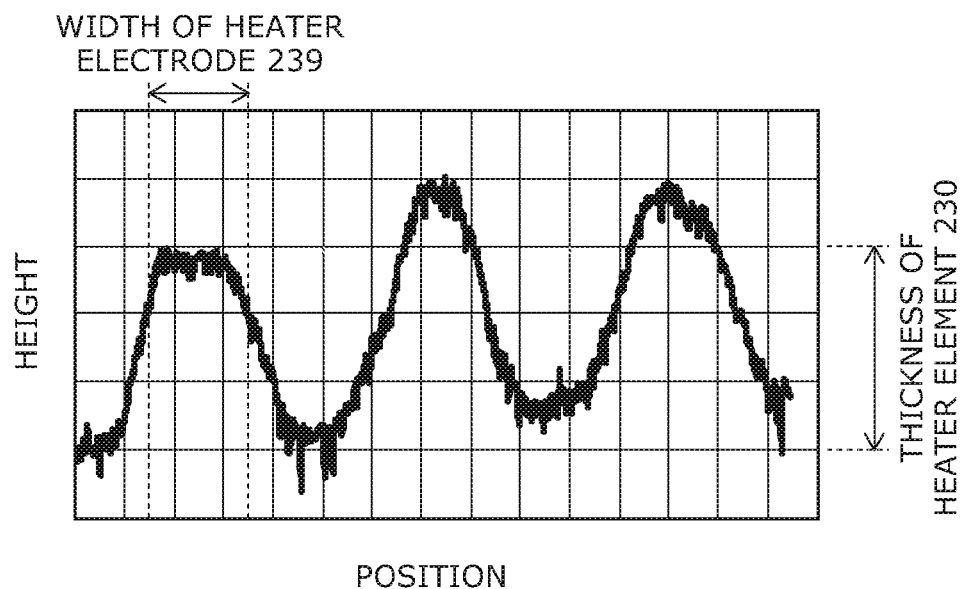
FIGS. 16A and 16B are schematic cross-sectional views describing configurations of the surface of the heater plate according to the embodiment.
Figure 16B:
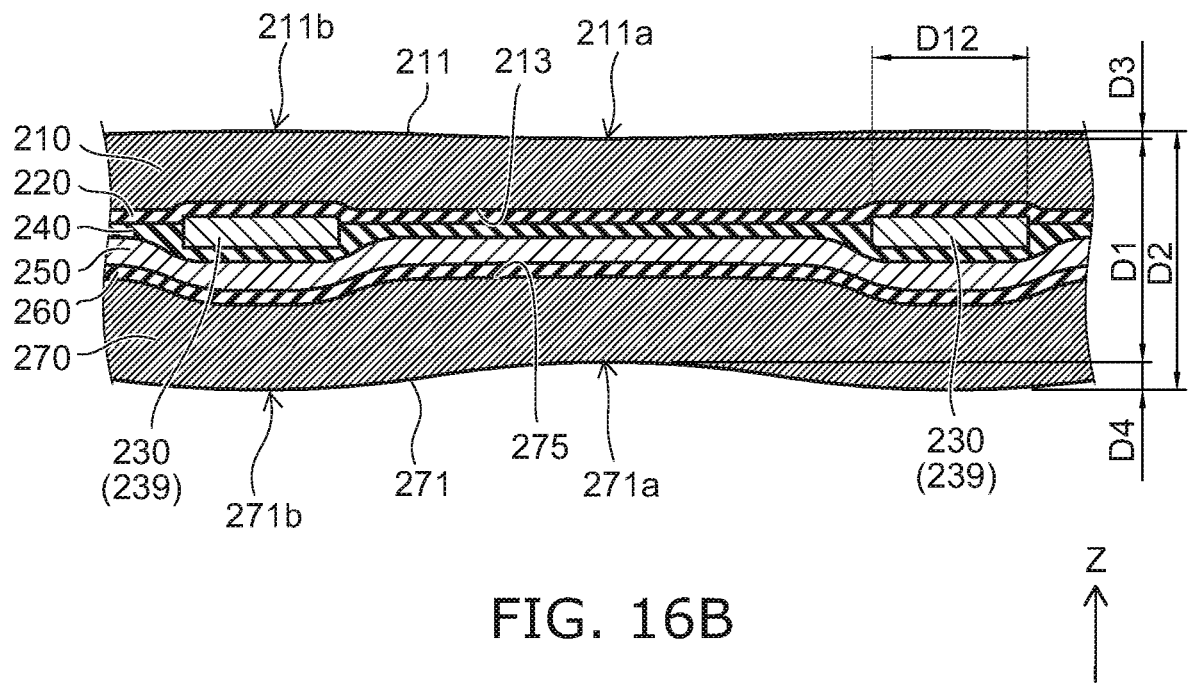

FIG. 16B is a schematic view describing the configuration of the surface of the heater plate of the embodiment.

FIG. 16A is a graph illustrating an example of results of measurements of the configuration of the surface 271 of the second support plate 270 by the inventor. FIG. 16B is a schematic cross-sectional view describing the configuration of the surface of the heater plate 200 of the embodiment.

As described above in reference to FIG. 8, the members of the heater plate 200 are pressed by a hot pressing machine in a state of being stacked. At this time, as illustrated in FIG. 16B, a first unevenness occurs in the surface 211 (the upper surface) of the first support plate 210; and a second unevenness occurs in the surface 271 (the lower surface) of the second support plate 270. A third unevenness occurs in a surface 213 (the lower surface) of the first support plate 210. A fourth unevenness occurs in a surface 275 (the upper surface) of the second support plate 270.

The inventor measured the configuration of the surface 271 of the second support plate 270. An example of the measurement results is as illustrated in FIG. 16A. As illustrated in FIG. 16A and FIG. 16B, the configuration of the surface 211 (the upper surface) of the first support plate 210 and the configuration of the surface 271 of the second support plate 270 follow the configuration of the heater element 230 or the arrangement of the heater element 230. The configuration of the heater element 230 refers to the thickness of the heater element 230 and the width of the heater element 230 (the width of the heater electrode 239).

A distance D1 in the Z-direction between a recess 211a (the recess 211a of the first unevenness) of the surface 211 of the first support plate 210 and a recess 271a (the recess 271a of the second unevenness) of the surface 271 of the second support plate 270 is shorter than a distance D2 in the Z-direction between a protrusion 211b (the protrusion 211b of the first unevenness) of the surface 211 of the first support plate 210 and a protrusion 271b (the protrusion 271b of the second unevenness) of the surface 271 of the second support plate 270.

A distance D3 in the Z-direction between the recess 211a of the surface 211 of the first support plate 210 and the protrusion 211b of the surface 211 of the first support plate 210 (the unevenness height of the surface 211 of the first support plate 210, i.e., the height of the first unevenness) is shorter than a distance D4 in the Z-direction between the recess 271a of the surface 271 of the second support plate 270 and the protrusion 271b of the surface 271 of the second support plate 270 (the unevenness height of the surface 271 of the second support plate 270, i.e., the height of the second unevenness). That is, the unevenness height of the surface 211 of the first support plate 210 (the height of the first unevenness) is lower than the unevenness height of the surface 271 of the second support plate 270 (the height of the second unevenness).

The width of the recess 271a of the surface 271 of the second support plate 270 is about the same as the width of the region between the two mutually-adjacent heater electrodes 239 (a slit portion of the heater element 230). The width of the recess 271a of the surface 271 of the second support plate 270 is, for example, not less than 0.25 times and not more than 2.5 times the width of the region between the two mutually-adjacent heater electrodes 239.

The width of the protrusion 271b of the surface 271 of the second support plate 270 is about the same as the width of the heater electrode 239. The width of the protrusion 271b of the surface 271 of the second support plate 270 is, for example, not less than 0.8 times and not more than 1.2 times the width of the heater electrode 239.

The unevenness height D4 of the surface 271 of the second support plate 270 is about the same as the thickness of the heater element 230 (the thickness of the heater electrode 239). The unevenness height D4 of the second support plate 270 is not less than 0.8 times and not more than 1.2 times the thickness of the heater element 230.

Similarly, the width of the recess 211a of the surface 211 of the first support plate 210 is about the same as the width of the region between the two mutually-adjacent heater electrodes 239. The width of the protrusion 211b of the surface 211 of the first support plate 210 is about the same as the width of the heater electrode 239. On the other hand, the unevenness height D3 of the surface 211 of the first support plate 210 is lower than the thickness of the heater element 230.

The height of the surface 271 of the second support plate 270 changes smoothly from the protrusion 271b toward the adjacent recess 271a. For example, the height of the surface 271 of the second support plate 270 decreases continuously from the center in the width direction of the protrusion 271b toward the center in the width direction of the adjacent recess 271a. More specifically, the center in the width direction of the protrusion 271b is the position of the surface 271 overlapping, in the Z-direction, the center in the width direction of the heater electrode 239. More specifically, the center in the width direction of the recess 271a is the position of the surface 271 overlapping, in the Z-direction, the center in the width direction of the region between the two mutually-adjacent heater electrodes 239.

Thus, the height of the surface 271 of the second support plate 270 changes in a wave-like configuration having the portions overlapping the heater electrode 239 as apexes and the portions not overlapping the heater electrode 239 as lowest points. Similarly, the height of the surface 211 of the first support plate 210 changes in a wave-like configuration having the portions overlapping the heater electrode 239 as apexes and the portions not overlapping the heater electrode 239 as lowest points.

According to the embodiment, because the surface 211 of the first support plate 210 has the first unevenness, the bonding surface area between the first support plate 210 and the heater element 230 can be wider; and the bonding strength between the first support plate 210 and the heater element 230 can be increased. Due to the first unevenness, the bonding surface area between the first support plate 210 and the bonding agent 403 also can be wider. Thereby, the coupling strength between the first support plate 210 and the bonding agent 403 also can be improved. Because the first support plate 210 has the unevenness, the rigidity of the first support plate 210 is high. Therefore, the warp and/or deformation of the heater plate 200 can be reduced even in the case where the first support plate 210 is thin. Thereby, for example, both "thermal capacity reduction" that affects high throughput and "warp reduction of the heater plate," which generally have an antinomic relationship, can be realized. Because the surface 271 of the second support plate 270 has the second unevenness, the bonding surface area between the second support plate 270 and the bypass layer 250 can be wider; and the bonding strength between the second support plate 270 and the bypass layer 250 can be increased. Due to the second unevenness, the bonding surface area between the second support plate 270 and the bonding agent 403 also can be wider. Thereby, the coupling strength between the second support plate 270 and the bonding agent 403 also can be improved. Because the second support plate 270 has the unevenness, the rigidity of the second support plate 270 is high. Therefore, even in the case where the second support plate 270 is thin, the warp and/or deformation of the heater plate 200 can be reduced. Thereby, for example, both "thermal capacity reduction" that affects high throughput and "warp reduction of the heater plate," which generally have an antinomic relationship, can be realized. Because the surface 211 of the first support plate 210 has the first unevenness, the distance between the heater element 230 and the processing object W can be shorter. Thereby, the speed of increasing the temperature of the processing object W can be increased.

Figure 17A:
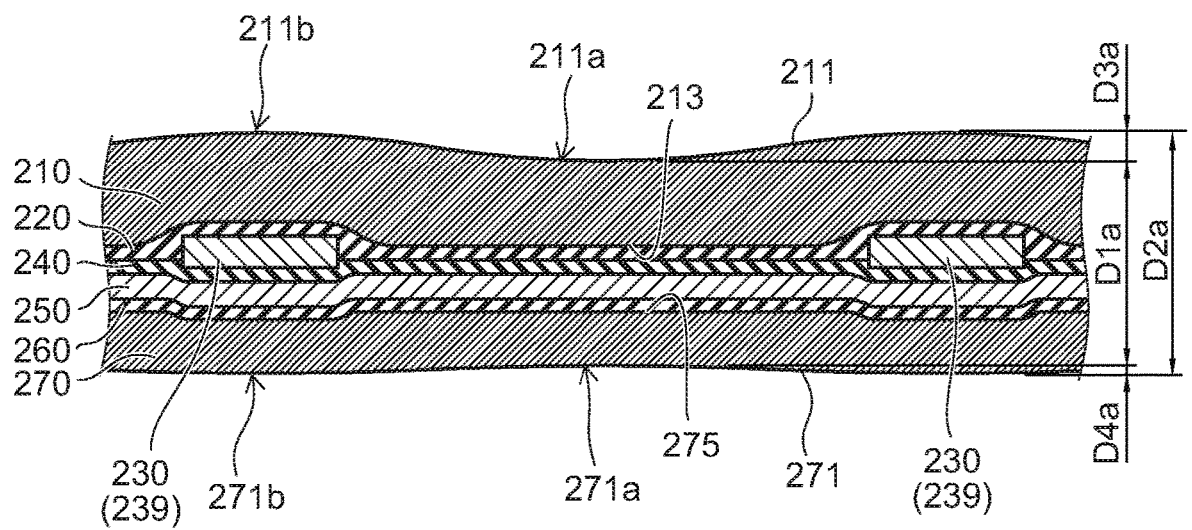
FIG. 17A to FIG. 17C are schematic cross-sectional views describing configurations of the surface of the heater plate according to modifications of the embodiment.
Figure 17B:
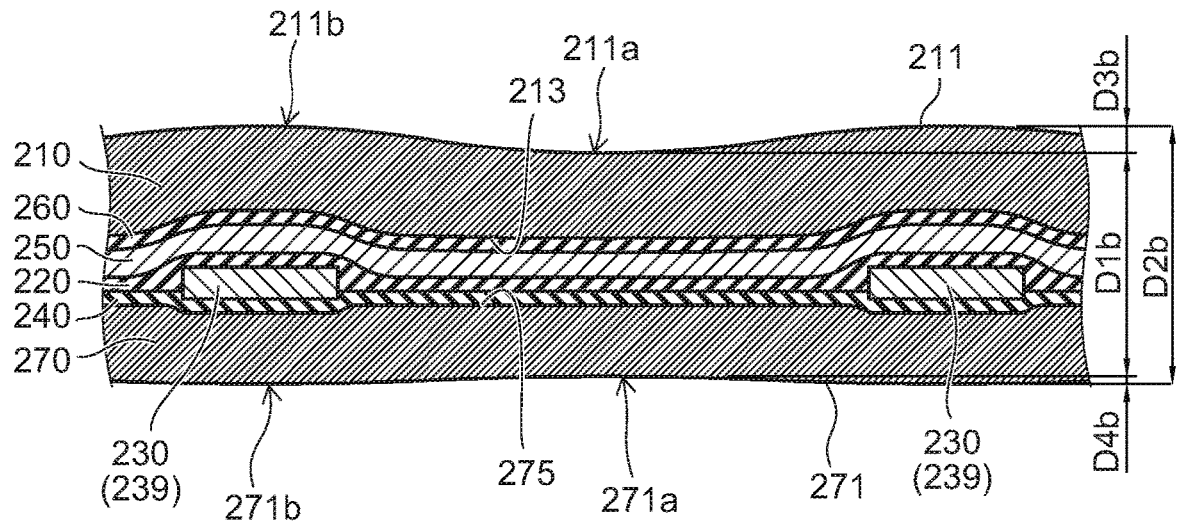
Figure 17C:
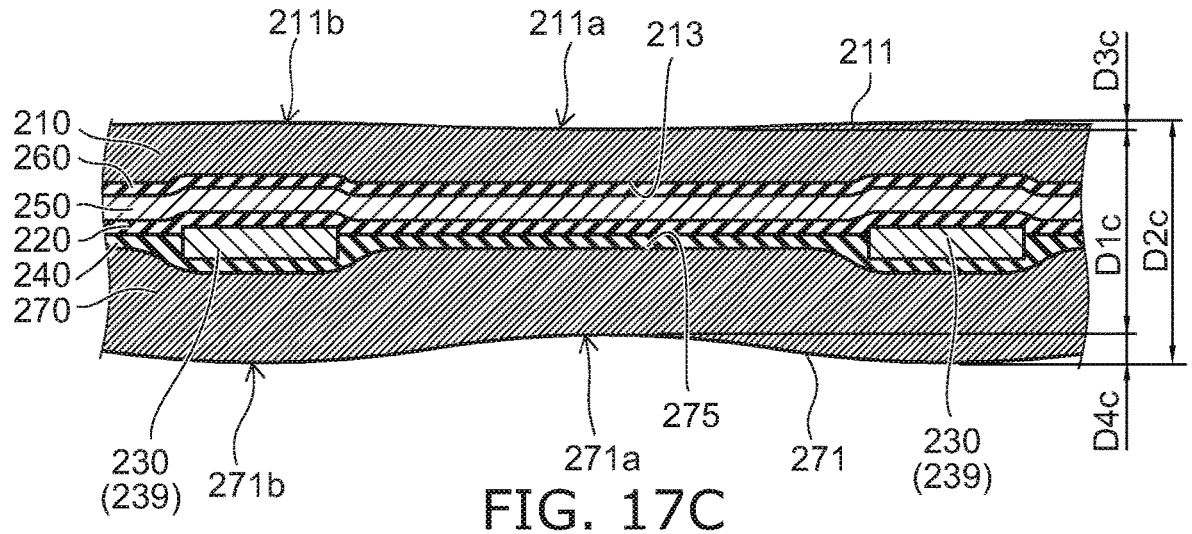

FIG. 17A to FIG. 17C are schematic cross-sectional views describing configurations of the surface of the heater plate according to modifications of the embodiment.

Similarly to the description relating to FIG. 16B, the first to fourth unevennesses occur also in the heater plates 200 shown in FIG. 17A to FIG. 17C.

As shown in FIG. 17A, a distance D1a in the Z-direction between the recess 211a and the recess 271a is shorter than a distance D2a in the Z-direction between the protrusion 211b and the protrusion 271b.

In the example shown in FIG. 17A, unlike the example shown in FIG. 16B, a distance D3a in the Z-direction between the recess 211a and the protrusion 211b (the unevenness height of the surface 211 of the first support plate 210, i.e., the height of the first unevenness) is longer than a distance D4a in the Z-direction between the recess 271a and the protrusion 271b (the unevenness height of the surface 271 of the second support plate 270, i.e., the height of the second unevenness). That is, in the example, the unevenness height of the surface 211 of the first support plate 210 (the height of the first unevenness) is higher than the unevenness height of the surface 271 of the second support plate 270 (the height of the second unevenness).

The unevenness height D3a of the surface 211 of the first support plate 210 is about the same as the thickness of the heater element 230, e.g., not less than 0.8 times and not more than 1.2 times the thickness of the heater element 230. On the other hand, the unevenness height D4a of the surface 271 of the second support plate 270 is lower than the thickness of the heater element 230.

The width of the recess 211a and the width of the recess 271a each are about the same as the width of the region between two adjacent heater electrodes 239. The width of the protrusion 211b and the width of the protrusion 271b each are about the same as the width of the heater electrode 239.

Similarly to the description relating to FIG. 16B, the height of the surface 271 of the second support plate 270 and the height of the surface 211 of the first support plate 210 each change in wave-like configurations in the example shown in FIG. 17A as well. By providing such a first unevenness and second unevenness, the bonding surface area is wider; and the bonding strength increases.

As in the example shown in FIG. 16B, in the case where the height of the second unevenness (the distance D4) is higher than the height of the first unevenness (the distance D3), the bonding surface area between the heater plate 200 and the base plate 300 can be set to be wide. Thereby, the bonding strength between the heater plate 200 and the base plate 300 can be increased.

On the other hand, as in the example shown in FIG. 17A, in the case where the first unevenness height (the distance D3a) is higher than the second unevenness height (the distance D4a), in particular, the bonding surface area between the heater plate 200 and the ceramic dielectric substrate 100 can be set to be wide. Thereby, the bonding strength between the heater plate 200 and the ceramic dielectric substrate 100 can be increased.

In the example shown in FIG. 17A, the heater element 230 is provided between the first support plate 210 and the bypass layer 250. In such a case, the diffusability of the heat supplied from the heater element 230 to the base plate 300 side can be improved. Specifically, the thermal diffusion in the in-plane direction (the horizontal direction) of the processing object W can be improved. For example, the heat that is supplied to the coolant flowing through the base plate 300 is more uniform in the in-plane direction. Thereby, the temperature difference in the plane caused by the base plate 300 (the coolant) can be reduced.

The first support plate 210, the first resin layer 220, the second resin layer 240, the third resin layer 260, the heater element 230, the bypass layer 250, and the second support plate 270 are provided also in the heater plate 200 shown in FIG. 17B and FIG. 17C. However, the stacking orders in the examples shown in FIG. 17B and FIG. 17C are different from that of the heater plate 200 shown in FIG. 17A.

In the examples shown in FIG. 17B and FIG. 17C, the bypass layer 250 is provided between the first support plate 210 and the heater element 230. Thereby, the diffusability of the heat supplied from the heater element 230 to the processing object W side can be improved. Specifically, the thermal diffusion in the in-plane direction (the horizontal direction) of the processing object W can be improved. For example, the temperature difference in the plane caused by the heat emitted by the heater element 230 can be reduced. The details of this structure are described below in reference to FIG. 23.

In the example shown in FIG. 17B as well, a distance D1b in the Z-direction between the recess 211a and the recess 271a is shorter than a distance D2b in the Z-direction between the protrusion 211b and the protrusion 271b.

A distance D3b in the Z-direction between the recess 211a and the protrusion 211b (the unevenness height of the surface 211 of the first support plate 210, i.e., the height of the first unevenness) is longer than a distance D4b in the Z-direction between the recess 271a and the protrusion 271b (the unevenness height of the surface 271 of the second support plate 270, i.e., the height of the second unevenness). That is, in the example, the unevenness height of the surface 211 of the first support plate 210 (the height of the first unevenness) is higher than the unevenness height of the surface 271 of the second support plate 270 (the height of the second unevenness).

The unevenness height D3b of the surface 211 of the first support plate 210 is about the same as the thickness of the heater element 230 and is, for example, not less than 0.8 times and not more than 1.2 times the thickness of the heater element 230. On the other hand, the unevenness height D4b of the surface 271 of the second support plate 270 is lower than the thickness of the heater element 230.

The widths of the recess 211a, the recess 271a, the protrusion 211b, and the protrusion 271b each are similar to those of the description relating to FIG. 17A.

By setting the first unevenness height (the distance D3b) to be higher than the second unevenness height (the distance D4b) in the heater plate 200 shown in FIG. 17B, similarly to the case of FIG. 17A, the bonding strength between the heater plate 200 and the ceramic dielectric substrate 100 can be increased.

For example, there are cases where the temperature difference (the relative displacement) between the heater plate 200 and the ceramic dielectric substrate 100 becomes large due to the heat transferred from the processing object W to the electrostatic chuck, etc., due to the plasma processing. In such a case, the reliability can be greatly increased by increasing the bonding strength between the heater plate 200 and the ceramic dielectric substrate 100 by using a heater plate such as the heater plates shown in FIG. 17A and FIG. 17B.

In the example shown in FIG. 17C as well, a distance D1c in the Z-direction between the recess 211a and the recess 271a is shorter than a distance D2c in the Z-direction between the protrusion 211b and the protrusion 271b.

A distance D3c in the Z-direction between the recess 211a and the protrusion 211b (the unevenness height of the surface 211 of the first support plate 210, i.e., the height of the first unevenness) is shorter than a distance D4c in the Z-direction between the recess 271a and the protrusion 271b (the unevenness height of the surface 271 of the second support plate 270, i.e., the height of the second unevenness). That is, in the example, the unevenness height of the surface 211 of the first support plate 210 (the height of the first unevenness) is lower than the unevenness height of the surface 271 of the second support plate 270 (the height of the second unevenness).

The unevenness height D4c of the surface 271 of the second support plate 270 is about the same as the thickness of the heater element 230 and is, for example, not less than 0.8 times and not more than 1.2 times the thickness of the heater element 230. On the other hand, the unevenness height D3c of the surface 211 of the first support plate 210 is lower than the thickness of the heater element 230.

The widths of the recess 211a, the recess 271a, the protrusion 211b, and the protrusion 271b each are similar to those of the description relating to FIG. 17A.

In the heater plate 200 shown in FIG. 17C as well, by setting the second unevenness height (the distance D4c) to be higher than the first unevenness height (the distance D3c), similarly to the case of FIG. 16B, the bonding surface area between the heater plate 200 and the base plate can be set to be wide. Thereby, the bonding strength between the heater plate 200 and the base plate 300 can be increased.

For example, there are cases where the temperature difference (the relative displacement) between the heater plate 200 and the base plate 300 easily becomes large due to the heat emitted by the heater element 230, etc. In such a case, the reliability can be greatly increased by increasing the bonding strength between the heater plate 200 and the base plate 300 as shown in FIG. 16B or FIG. 17C.

For example, the first and second unevenness heights can be controlled by the processing conditions of the hot pressing. As an example, the first and second unevenness heights can be controlled using the materials and/or hardnesses of the member pressing the stacked body from the upper side and the member pressing the stacked body from the lower side.

Figure 18A:
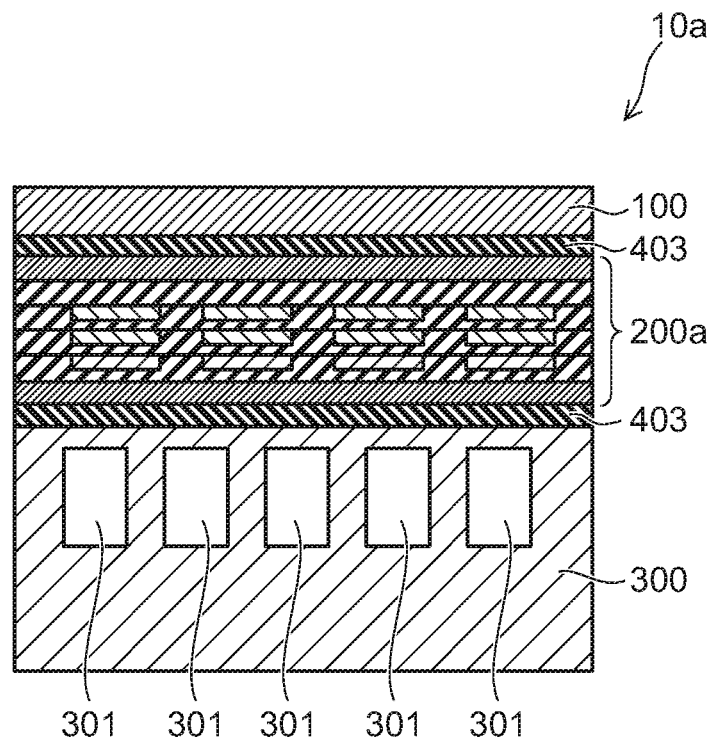
FIGS. 18A and 18B are schematic cross-sectional views illustrating an electrostatic chuck according to a modification of the embodiment.
Figure 18B:
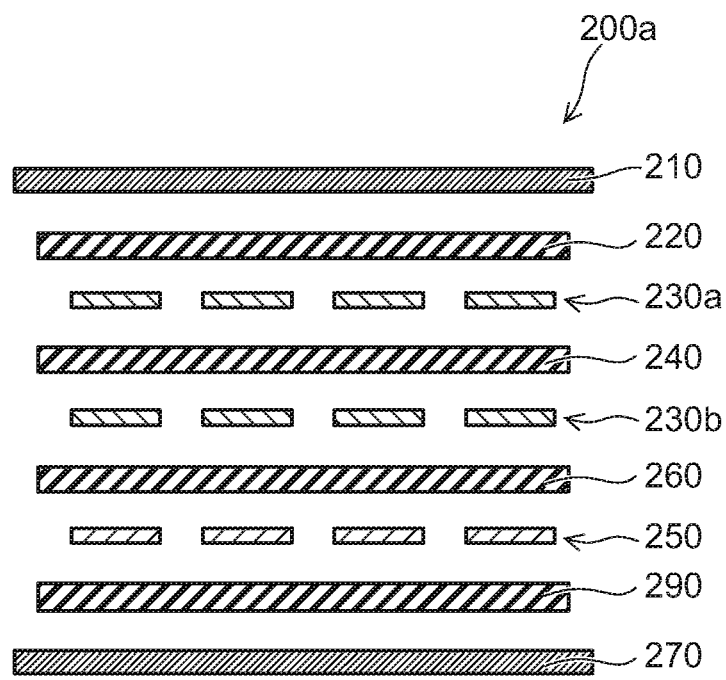

FIGS. 18A and 18B are schematic cross-sectional views illustrating an electrostatic chuck according to a modification of the embodiment.

FIG. 18A is a schematic cross-sectional view illustrating the electrostatic chuck according to the modification of the embodiment. FIG. 18B is a schematic cross-sectional view illustrating the heater plate of the modification. For example, FIG. 18A and FIG. 18B correspond to a schematic cross-sectional view of the A1-A1 cross section illustrated in FIG. 1.

The electrostatic chuck 10a illustrated in FIG. 18A includes the ceramic dielectric substrate 100, a heater plate 200a, and the base plate 300. The ceramic dielectric substrate 100 and the base plate 300 are as described above in reference to FIG. 1 and FIGS. 2A and 2B.

As illustrated in FIG. 18B, the heater plate 200a of this specific example includes multiple heater elements. The heater plate 200a illustrated in FIG. 18B includes the first resin layer 220, a first heater element (a heating layer) 230a, the second resin layer 240, a second heater element (a heating layer) 230b, the third resin layer 260, the bypass layer 250, a fourth resin layer 290, and the second support plate 270.

The first resin layer 220 is provided between the first support plate 210 and the second support plate 270. The first heater element 230a is provided between the first resin layer 220 and the second support plate 270. The second resin layer 240 is provided between the first heater element 230a and the second support plate 270. The second heater element 230b is provided between the second resin layer 240 and the second support plate 270. The third resin layer 260 is provided between the second heater element 230b and the second support plate 270. The bypass layer 250 is provided between the third resin layer 260 and the second support plate 270. The fourth resin layer 290 is provided between the bypass layer 250 and the second support plate 270. That is, in this specific example, the first heater element 230a is provided in an independent state a layer different from that of the second heater element 230b.

The materials, thicknesses, and functions of the first support plate 210, the first resin layer 220, the second resin layer 240, the third resin layer 260, the bypass layer 250, and the second support plate 270 each are as described above in reference to FIG. 3 to FIG. 5. The materials, thicknesses, and functions of the first heater element 230a and the second heater element 230b each are the same as those of the heater element 230 described above in reference to FIG. 3 to FIG. 5. The fourth resin layer 290 is the same as the first resin layer 220 described above in reference to FIG. 3 to FIG. 5.

According to the modification, because the first heater element 230a is disposed independently in a layer different from that of the second heater element 230b, the temperature in the plane of the processing object W can be controlled independently for each prescribed region.

Figure 19A:
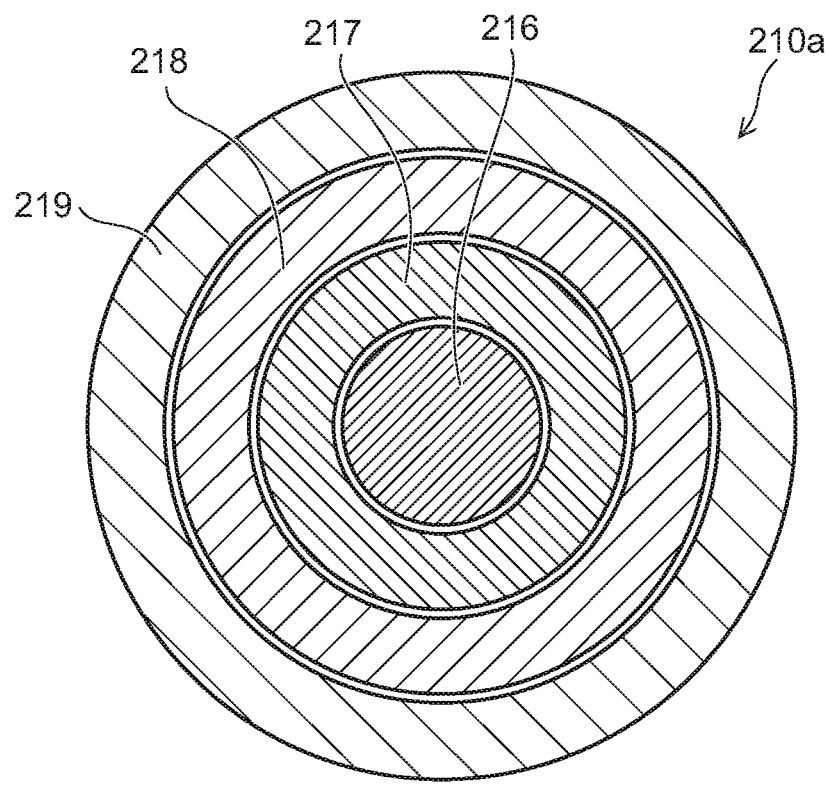
FIGS. 19A and 19B are schematic plan views illustrating modifications of the first support plate of the embodiment.
Figure 19B:
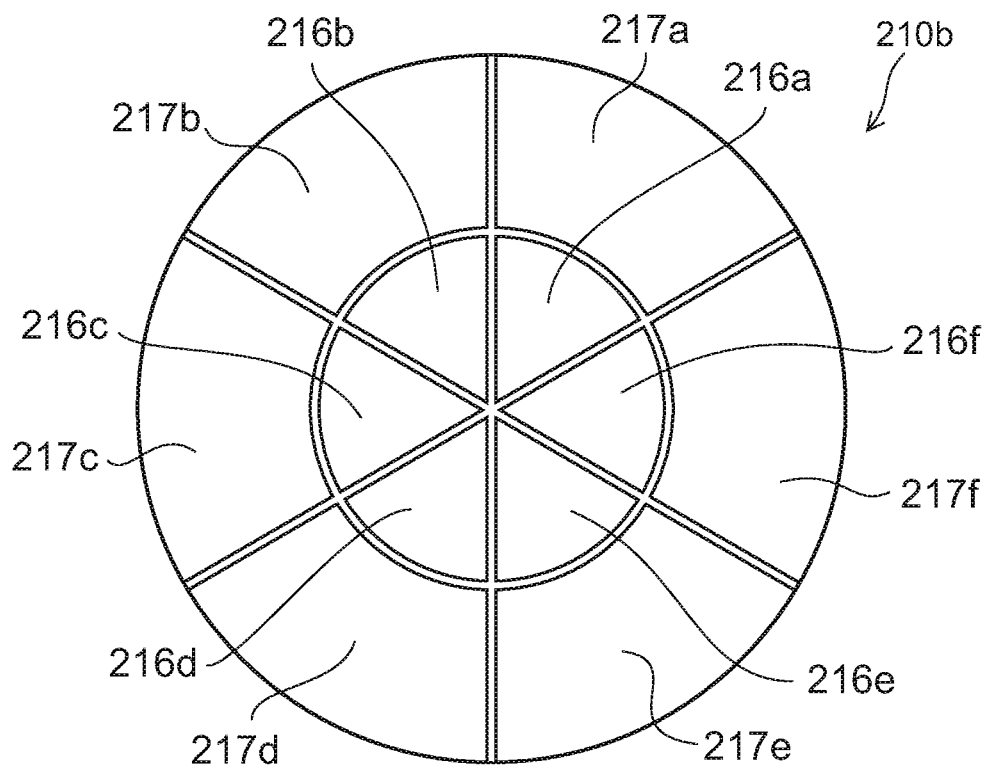
Figure 20:
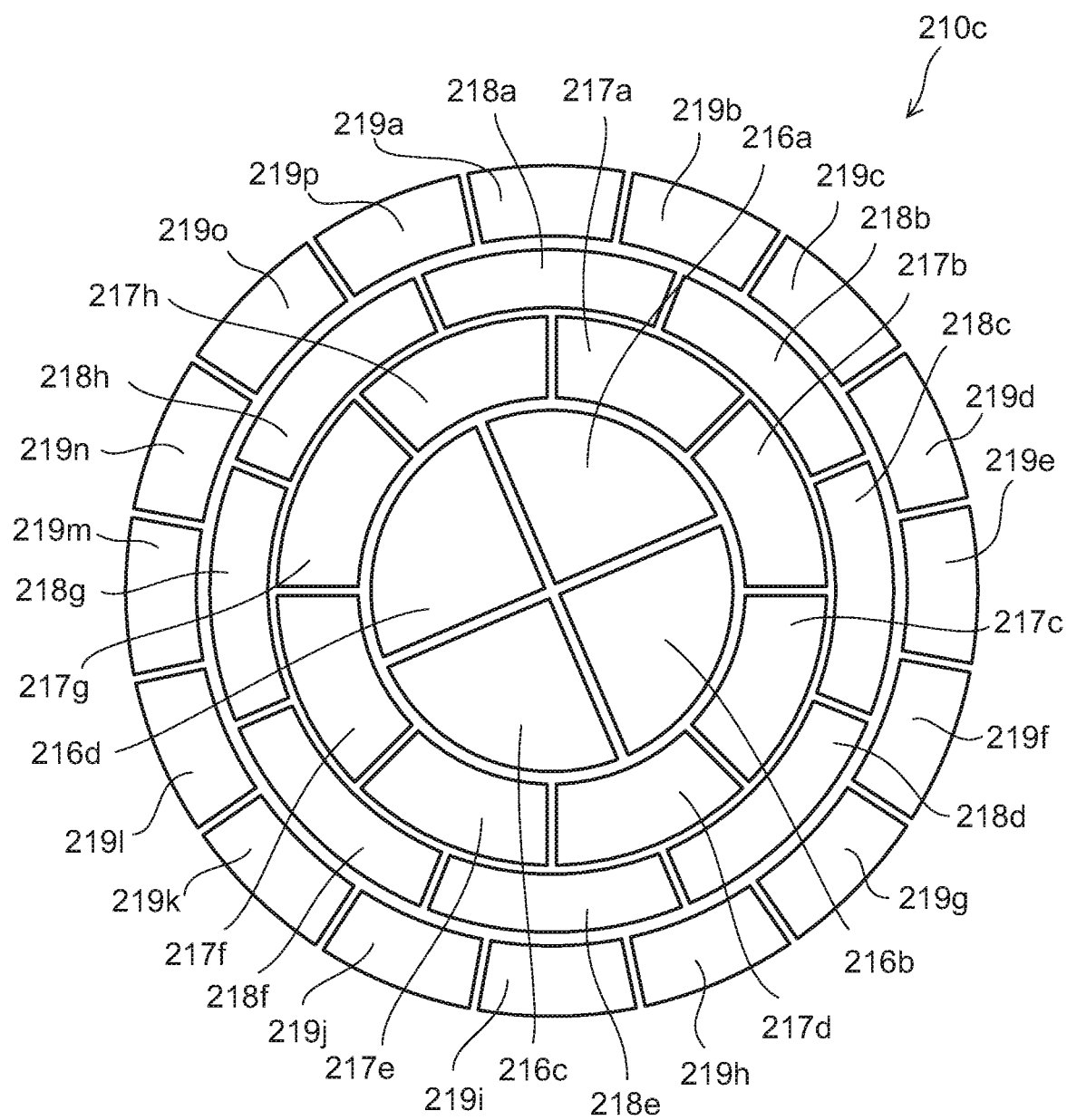
FIG. 20 is a schematic plan view illustrating modifications of the first support plate of the embodiment.

FIG. 19A to FIG. 20 are schematic plan views illustrating modifications of the first support plate of the embodiment.

Figure 21:
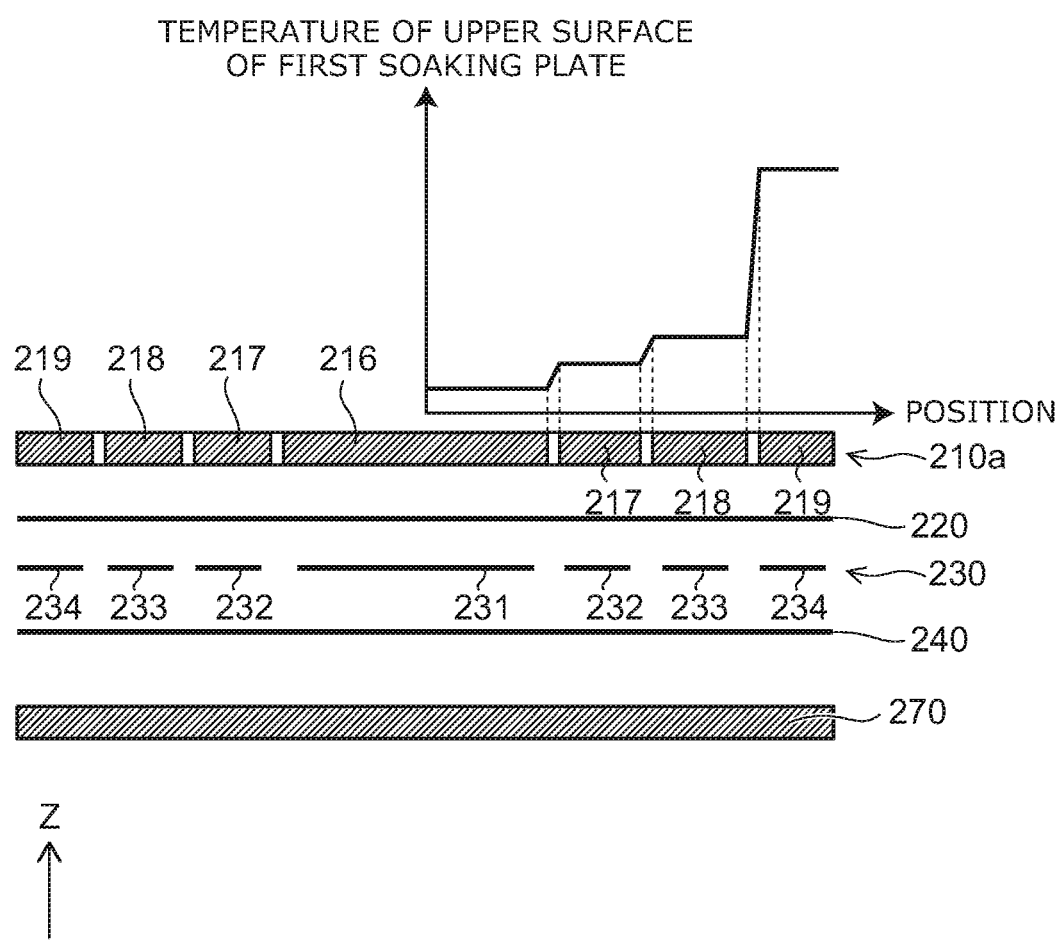
FIG. 21 is a schematic cross-sectional view illustrating the heater plate of the modification.

FIG. 21 is a schematic cross-sectional view illustrating the heater plate of the modification.

FIG. 19A illustrates an example in which the first support plate is subdivided into multiple support portions. FIG. 19B and FIG. 20 illustrate other examples in which the first support plate is subdivided into multiple support portions.

In FIG. 21, the heater plate illustrated in FIG. 19A and a graph of the temperature of the upper surface of the first support plate are illustrated together for convenience of description. The graph illustrated in FIG. 21 is an example of the temperature of the upper surface of the first support plate. The horizontal axis of the graph illustrated in FIG. 21 illustrates the position of the upper surface of a first support plate 210a. The vertical axis of the graph illustrated in FIG. 21 illustrates the temperature of the upper surface of the first support plate 210a. The bypass layer 250 and the third resin layer 260 are not illustrated in FIG. 21 for convenience of description.

In the modifications illustrated in FIG. 19A and FIG. 19B, the first support plate 210a is subdivided into multiple support portions. More specifically, in the modification illustrated in FIG. 19A, the first support plate 210a is subdivided into multiple support portions having concentric circular configurations, and includes a first support portion 216, a second support portion 217, a third support portion 218, and a fourth support portion 219. In the modification illustrated in FIG. 19B, a first support plate 210b is subdivided into multiple support portions having concentric circular configurations and radial configurations, and includes a first support portion 216a, a second support portion 216b, a third support portion 216c, a fourth support portion 216d, a fifth support portion 216e, a sixth support portion 216f, a seventh support portion 217a, an eighth support portion 217b, a ninth support portion 217c, a tenth support portion 217d, an eleventh support portion 217e, and a twelfth support portion 217f.

In the modification illustrated in FIG. 20, a first support plate 210c further includes many support portions. In the first support plate 210c of FIG. 20, the first support portion 216 shown in FIG. 19A is further subdivided into four support portions 216a to 216d. The second support portion 217 shown in FIG. 19A is further subdivided into eight support portions 217a to 217h. The third support portion 218 shown in FIG. 19A is further subdivided into eight regions 218a to 218h. The fourth support portion 219 shown in FIG. 19A is further subdivided into sixteen support portions 219a to 219p. Thus, the number and configurations of support portions provided in the first support plate 210 may be arbitrary.

The first resin layer 220, the heater element 230, the second resin layer 240, the bypass layer 250, the third resin layer 260, the second support plate 270, and the power supply terminal 280 each are as described above in reference to FIG. 3 to FIG. 5.

In the description hereinbelow relating to FIG. 19A to FIG. 21, the first support plate 210a illustrated in FIG. 19A is used as an example. As illustrated in FIG. 21, the first support portion 216 is provided on the first region 231 of the heater element 230 and corresponds to the first region 231 of the heater element 230. The second support portion 217 is provided on the second region 232 of the heater element 230 and corresponds to the second region 232 of the heater element 230. The third support portion 218 is provided on the third region 233 of the heater element 230 and corresponds to the third region 233 of the heater element 230. The fourth support portion 219 is provided on the fourth region 234 of the heater element 230 and corresponds to the fourth region 234 of the heater element 230.

The first support portion 216 is not coupled electrically to the second support portion 217. The second support portion 217 is not coupled electrically to the third support portion 218. The third support portion 218 is not coupled electrically to the fourth support portion 219.

According to the modification, a temperature difference in the diametrical direction in the planes of the first support plates 210a, 210b, and 210c can be provided deliberately (temperature controllability). For example, the temperature difference can be provided in a step configuration from the first support portion 216 to the fourth support portion 219 as in the graph illustrated in FIG. 21. Thereby, the temperature difference can be provided deliberately in the plane of the processing object W (temperature controllability).

Figure 22A:
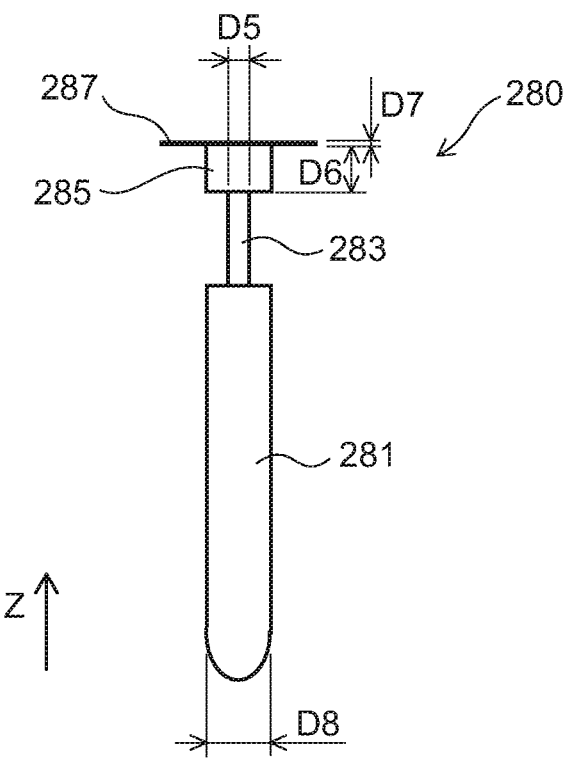
FIGS. 22A and 22B are schematic plan views illustrating a specific example of a power supply terminal of the embodiment.
Figure 22B:
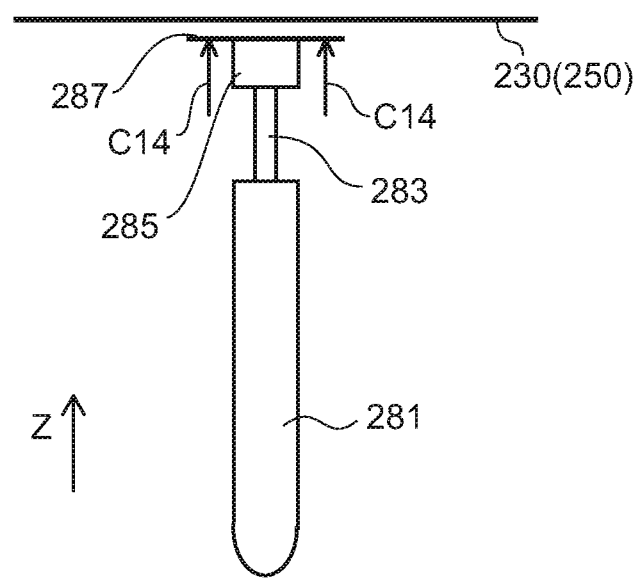

FIGS. 22A and 22B are schematic plan views illustrating a specific example of a power supply terminal of the embodiment.

FIG. 22A is a schematic plan view illustrating the power supply terminal of this specific example. FIG. 22B is a schematic plan view illustrating a method for coupling the power supply terminal of this specific example.

The power supply terminal 280 illustrated in FIG. 22A and FIG. 22B includes a pin portion 281, a conducting lead portion 283, a support portion 285, and a coupling portion 287. The pin portion 281 is connected to a member called a socket, etc. The socket supplies electrical power from outside the electrostatic chuck 10. The conducting lead portion 283 is connected to the pin portion 281 and the support portion 285. The support portion 285 is connected to the conducting lead portion 283 and the coupling portion 287. As illustrated by arrow C14 illustrated in FIG. 22B, the coupling portion 287 is coupled to the heater element 230 or the bypass layer 250.

The conducting lead portion 283 relaxes the stress applied to the power supply terminal 280. In other words, the pin portion 281 is fixed to the base plate 300. On the other hand, the coupling portion 287 is coupled to the heater element 230 or the bypass layer 250. A temperature difference occurs between the base plate 300 and the heater element 230 or between the base plate 300 and the bypass layer 250. Therefore, a difference of the thermal expansion occurs between the base plate 300 and the heater element 230 or between the base plate 300 and the bypass layer 250. Therefore, the stress that is caused by the difference of the thermal expansion may be applied to the power supply terminal 280. For example, the stress that is caused by the difference of the thermal expansion is applied in the diametrical direction of the base plate 300. The conducting lead portion 283 can relax the stress. The coupling between the coupling portion 287 and the heater element 230 or between the coupling portion 287 and the bypass layer 250 is performed by welding, coupling utilizing a laser beam, soldering, brazing, etc.

For example, molybdenum or the like is an example of the material of the pin portion 281. For example, copper or the like is an example of the material of the conducting lead portion 283. A diameter D5 of the conducting lead portion 283 is smaller than a diameter D8 of the pin portion 281. The diameter D5 of the conducting lead portion 283 is, for example, not less than about 0.3 mm and not more than about 2.0 mm. For example, stainless steel or the like is an example of the material of the support portion 285. A thickness D6 (the length in the Z-direction) of the support portion 285 is, for example, not less than about 0.5 mm and not more than about 2.0 mm. For example, stainless steel or the like is an example of the material of the coupling portion 287. A thickness D7 (the length in the Z-direction) of the coupling portion 287 is, for example, not less than about 0.05 mm and not more than about 0.50 mm.

According to this specific example, the pin portion 281 can supply a relatively large current to the heater element 230 because the diameter D8 of the pin portion 281 is larger than the diameter D5 of the conducting lead portion 283. Because the diameter D5 of the conducting lead portion 283 is smaller than the diameter D8 of the pin portion 281, the conducting lead portion 283 deforms more easily than the pin portion 281; and the position of the pin portion 281 can be shifted from the center of the coupling portion 287. Thereby, the power supply terminal 280 can be fixed to a member (e.g., the base plate 300) that is different from the heater plate 200.

The support portion 285 is coupled to the conducting lead portion 283 and the coupling portion 287 by, for example, welding, coupling utilizing a laser beam, soldering, brazing, etc. Thereby, a wider contact surface area for the heater element 230 or the bypass layer 250 can be ensured while relaxing the stress applied to the power supply terminal 280.

Figure 23:
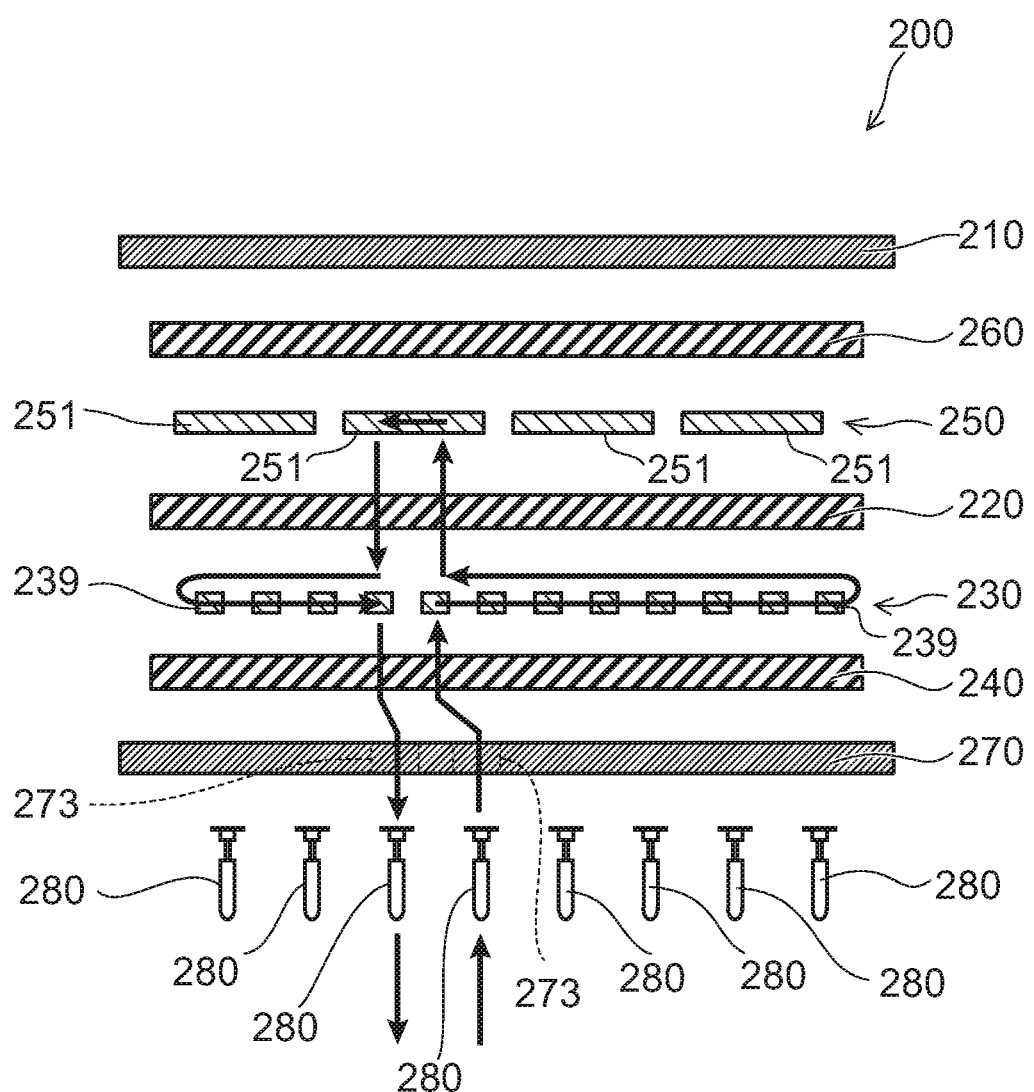
FIG. 23 is a schematic exploded view illustrating a modification of the heater plate of the embodiment.

FIG. 23 is a schematic exploded view illustrating a modification of the heater plate of the embodiment.

In the example as illustrated in FIG. 23, the bypass layer 250 is provided between the first support plate 210 and the heater element 230. More specifically, the bypass layer 250 is provided between the first support plate 210 and the first resin layer 220; and the third resin layer 260 is provided between the first support plate 210 and the bypass layer 250.

Thus, the bypass layer 250 may be provided between the first support plate 210 and the heater element 230. In other words, the bypass layer 250 may be provided between the heater element 230 and the ceramic dielectric substrate 100.

Even in such a case, the diffusability of the heat supplied from the heater element 230 can be improved by the bypass layer 250. For example, the thermal diffusion in the in-plane direction (the horizontal direction) of the processing object W can be improved. Thereby, for example, the uniformity of the temperature distribution in the plane of the processing object W can be increased.

For example, the bypass layer 250 may be provided both between the first support plate 210 and the heater element 230 and between the heater element 230 and the second support plate 270. In other words, the heater plate 200 may include two bypass layers 250 provided respectively between the first support plate 210 and the heater element 230 and between the heater element 230 and the second support plate 270.

Figure 24:
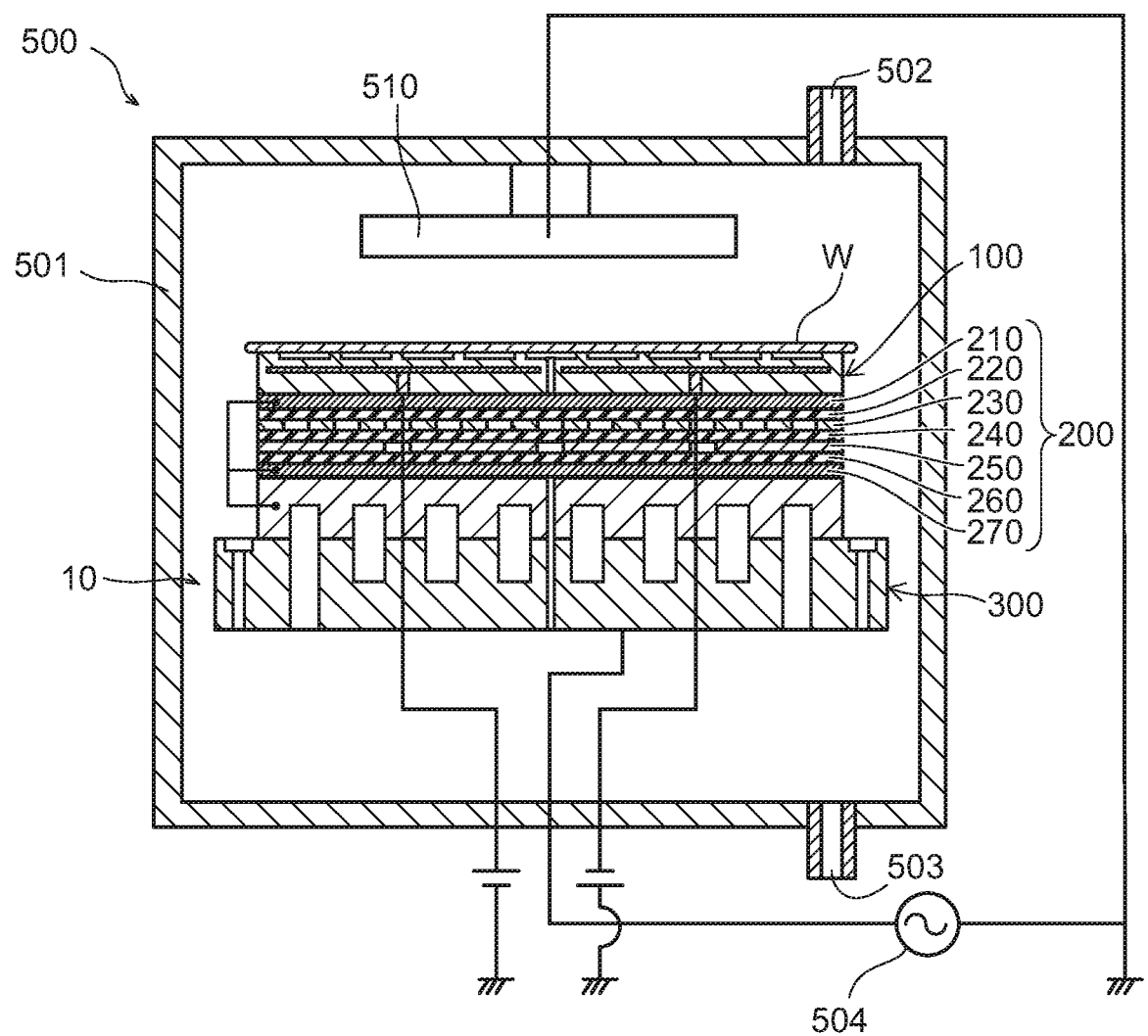
FIG. 24 is a schematic cross-sectional view illustrating a wafer processing apparatus according to another embodiment of the invention.

FIG. 24 is a schematic cross-sectional view illustrating a wafer processing apparatus according to another embodiment of the invention.

The wafer processing apparatus 500 according to the embodiment includes a processing container 501, an upper electrode 510, and an electrostatic chuck (e.g., the electrostatic chuck 10) described above in reference to FIG. 1 to FIG. 23. A processing gas inlet 502 for introducing the processing gas to the interior is provided in the ceiling of the processing container 501. An exhaust port 503 for evacuating the interior is provided in the bottom plate of the processing container 501. A high frequency power supply 504 is connected to the upper electrode 510 and the electrostatic chuck 10; and a pair of electrodes including the upper electrode 510 and the electrostatic chuck 10 opposes itself to be parallel and separated by a prescribed spacing.

When the high frequency voltage is applied between the upper electrode 510 and the electrostatic chuck 10 in the wafer processing apparatus 500 according to the embodiment, high frequency electric discharge occurs; the processing gas that is introduced to the processing container 501 is excited and activated by the plasma; and the processing object W is processed. As the processing object W, a semiconductor substrate (a wafer) may be illustrated. However, the processing object W is not limited to the semiconductor substrate (the wafer) and may be, for example, a glass substrate that is used in a liquid crystal display device, etc.

The high frequency power supply 504 is electrically connected to the base plate 300 of the electrostatic chuck 10. As described above, the base plate 300 includes a metal material such as aluminum, etc. In other words, the base plate 300 is electrically conductive. Thereby, the high frequency voltage is applied between the upper electrode 510 and the base plate 300.

In the wafer processing apparatus 500 of the example, the base plate 300 is electrically connected to the first support plate 210 and the second support plate 270. Thereby, in the wafer processing apparatus 500, the high frequency voltage is applied also between the first support plate 210 and the upper electrode 510 and between the second support plate 270 and the upper electrode 510.

Thus, the high frequency voltage is applied between the upper electrode 510 and each of the support plates 210 and 270. Thereby, compared to the case where the high frequency voltage is applied only between the base plate 300 and the upper electrode 510, the location where the high frequency voltage is applied can be more proximal to the processing object W. Thereby, for example, the plasma can be generated more efficiently and using a low potential.

Although an apparatus that has a configuration such as that of the wafer processing apparatus 500 generally is called a parallel plate-type RIE (Reactive Ion Etching) apparatus, the electrostatic chuck 10 according to the embodiment is not limited to applications for such an apparatus. For example, the electrostatic chuck 10 according to the embodiment is applicable widely to so-called reduced pressure processing apparatuses such as an ECR (Electron Cyclotron Resonance) etching apparatus, an inductively coupled plasma processing apparatus, a helicon wave plasma processing apparatus, a downstream plasma processing apparatus, a surface wave plasma processing apparatus, a plasma CVD (Chemical Vapor Deposition) apparatus, etc. The electrostatic chuck 10 according to the embodiment also is applicable widely to substrate processing apparatuses such as an exposure apparatus or an inspection apparatus in which the processing or the inspection is performed at atmospheric pressure. However, considering the high plasma resistance of the electrostatic chuck 10 according to the embodiment, it is favorable for the electrostatic chuck 10 to be applied to a plasma processing apparatus. In the configurations of these apparatuses, known configurations are applicable to the portions other than the electrostatic chuck 10 according to the embodiment; and a description is therefore omitted.

Figure 25:
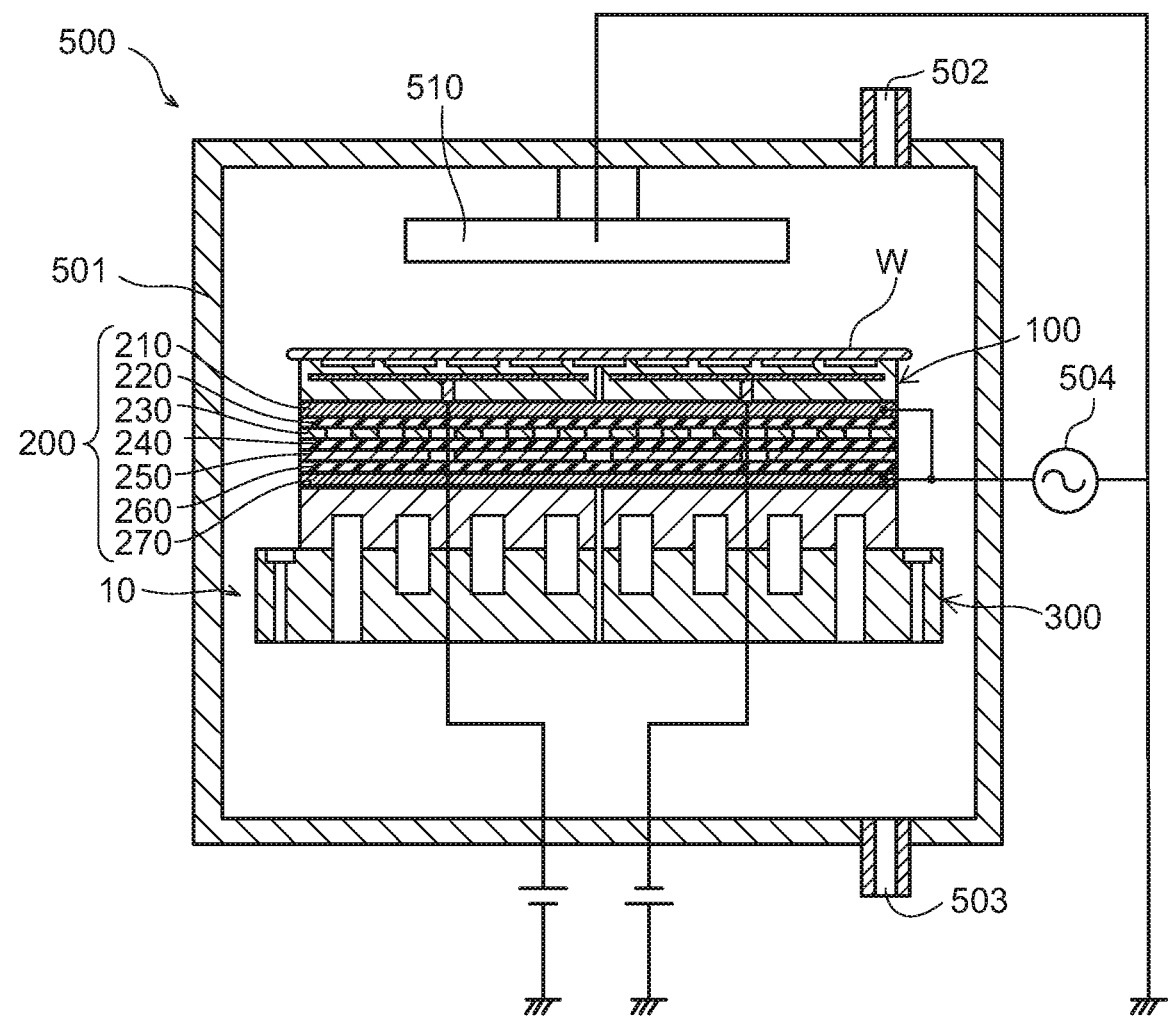
FIG. 25 is a schematic cross-sectional view illustrating a modification of the wafer processing apparatus according to another embodiment of the invention.

FIG. 25 is a schematic cross-sectional view illustrating a modification of the wafer processing apparatus according to another embodiment of the invention.

As illustrated in FIG. 25, the high frequency power supply 504 may be electrically connected only between the first support plate 210 and the upper electrode 510 and between the second support plate 270 and the upper electrode 510. Even in such a case, the location where the high frequency voltage is applied can be more proximal to the processing object W; and the plasma can be generated efficiently.

Figure 26:
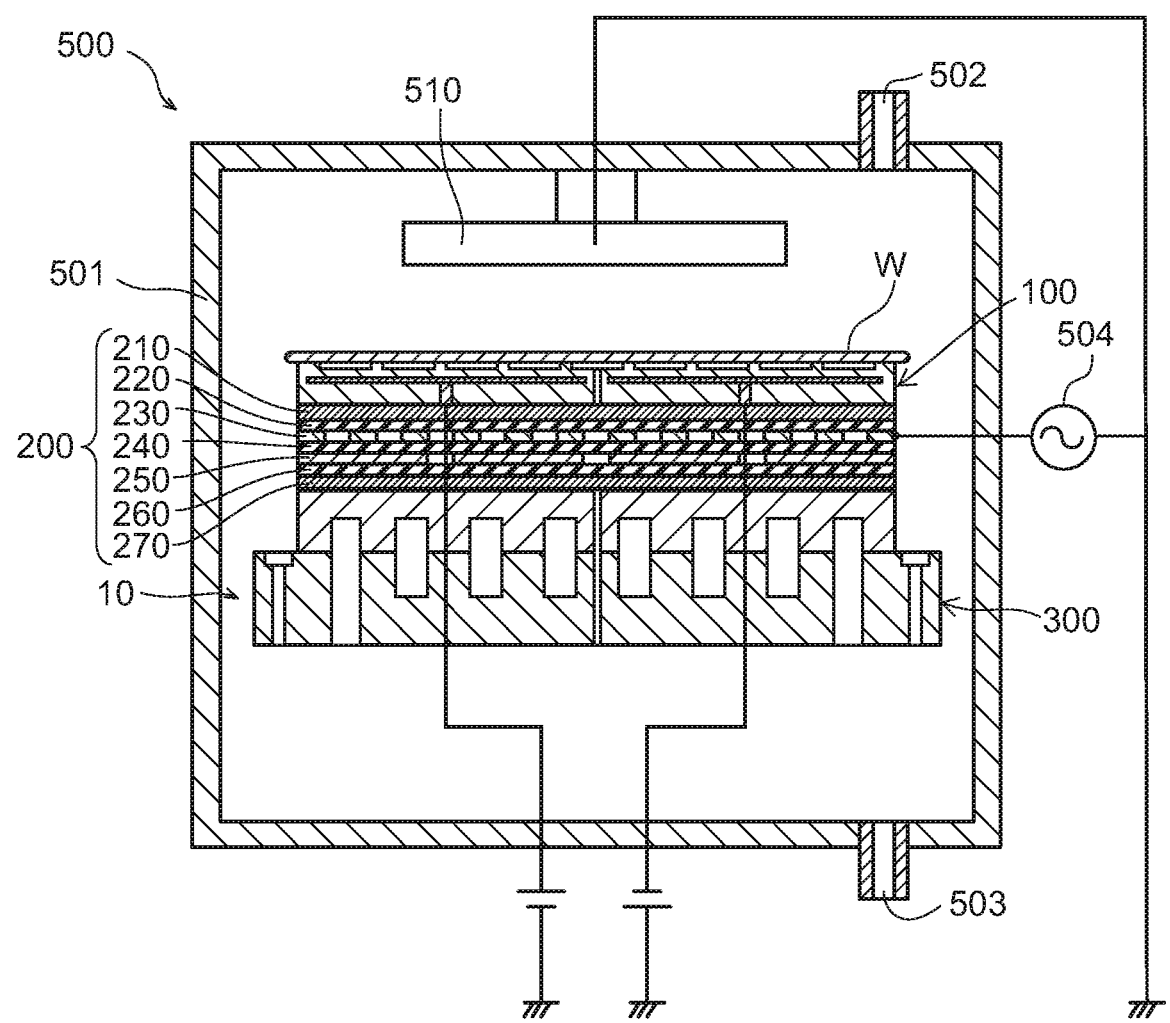
FIG. 26 is a schematic cross-sectional view illustrating a modification of the wafer processing apparatus according to another embodiment of the invention.

FIG. 26 is a schematic cross-sectional view illustrating a modification of the wafer processing apparatus according to another embodiment of the invention.

In the example as illustrated in FIG. 26, the high frequency power supply 504 is electrically connected to the heater element 230. Thus, the high frequency voltage may be applied between the heater element 230 and the upper electrode 510. Even in such a case, the location where the high frequency voltage is applied can be more proximal to the processing object W; and the plasma can be generated efficiently.

For example, the high frequency power supply 504 is electrically connected to the heater element 230 via the power supply terminals 280. For example, the high frequency voltage is selectively applied to multiple regions (e.g., the first to fourth regions 231 to 234 illustrated in FIG. 12A) of the heater element 230. Thereby, the distribution of the high frequency voltage can be controlled.

For example, the high frequency power supply 504 may be electrically connected to the first support plate 210, the second support plate 270, and the heater element 230. The high frequency voltage may be applied between the first support plate 210 and the upper electrode 510, between the second support plate 270 and the upper electrode 510, and between the heater element 230 and the upper electrode 510.

The embodiments of the invention have been described above. However, the invention is not limited to the above description. Those skilled in the art can appropriately modify the above embodiments, and such modifications are also encompassed within the scope of the invention as long as they include the features of the invention. For example, the configurations, the dimensions, the materials, the dispositions, etc., of the components included in the heater plates 200, 200a, 200b, etc., and the disposition methods, etc., of the heater element 230, the first heater element 230a, the second heater element 230b, and the bypass layer 250 are not limited to those illustrated and may be modified appropriately.

Furthermore, various components in the above embodiments can be combined with each other as long as technically feasible. Such combinations are also encompassed within the scope of the invention as long as they include the features of the invention.

What is claimed is:

1. An electrostatic chuck, comprising:
a ceramic dielectric substrate having a first major surface and a second major surface, the first major surface being where a processing object is placed, the second major surface being on a side opposite to the first major surface;
a base plate supporting the ceramic dielectric substrate and being provided at a position separated from the ceramic dielectric substrate; and
a heater plate provided between the ceramic dielectric substrate and the base plate,
the heater plate including
a first support plate including a metal, an upper surface of the first support plate having a first unevenness,
a second support plate including a metal, the second support plate being provided under the first support plate, a lower surface of the second support plate having a second unevenness,
a heater element provided between the first support plate and the second support plate, the heater element emitting heat due to a current flowing,
a first resin layer provided between the first support plate and the heater element, and
a second resin layer provided between the second support plate and the heater element.

2. The electrostatic chuck according to claim 1, wherein the first support plate is electrically connected to the second support plate.

3. The electrostatic chuck according to claim 2, wherein a surface area of a region where the first support plate is coupled to the second support plate is narrower than a surface area of an upper surface of the first support plate and narrower than a surface area of a lower surface of the second support plate.

4. The electrostatic chuck according to claim 3, wherein the surface area of the region where the first support plate is coupled to the second support plate is narrower than a surface area difference of a surface area of the heater element subtracted from the surface area of the upper surface of the first support plate and narrower than a surface area difference of the surface area of the heater element subtracted from the surface area of the lower surface of the second support plate.

5. The electrostatic chuck according to claim 1, wherein
the first unevenness follows a configuration of the heater element, and
the second unevenness follows the configuration of the heater element.

6. The electrostatic chuck according to claim 5, wherein a distance between a recess of the first unevenness and a recess of the second unevenness is shorter than a distance between a protrusion of the first unevenness and a protrusion of the second unevenness.

7. The electrostatic chuck according to claim 1, wherein a height of the first unevenness is different from a height of the second unevenness.

8. The electrostatic chuck according to claim 7, wherein the height of the first unevenness is lower than the height of the second unevenness.

9. The electrostatic chuck according to claim 7, wherein the height of the first unevenness is higher than the height of the second unevenness.

10. The electrostatic chuck according to claim 1, wherein
the heater element includes a plurality of heating electrodes that are independent of each other in a plurality of regions.

11. The electrostatic chuck according to claim 1, wherein
a plurality of the heater elements is provided, and
the plurality of heater elements is provided in a state of being independent in mutually-different layers.

12. The electrostatic chuck according to claim 1, further comprising a bypass layer provided between the heater element and the second support plate, the bypass layer being electrically conductive.

13. The electrostatic chuck according to claim 12, wherein the heater element is electrically coupled to the bypass layer and electrically insulated from the first support plate and the second support plate.

14. The electrostatic chuck according to claim 12, wherein a thickness of the bypass layer is thicker than a thickness of the first resin layer.

15. The electrostatic chuck according to claim 12, wherein a thickness of the bypass layer is thicker than a thickness of the heater element.

16. The electrostatic chuck according to claim 12, wherein the bypass layer is provided between the heater element and the base plate.

17. The electrostatic chuck according to claim 12, further comprising a power supply terminal provided from the heater plate toward the base plate, the power supply terminal supplying electrical power to the heater plate,
the power supply terminal including a pin portion connected to a socket, the socket supplying electrical power from the outside, a conducting lead portion finer than the pin portion, a support portion connected to the conducting lead portion, and a coupling portion connected to the support portion and coupled to the bypass layer, the electrical power being supplied to the heater element via the bypass layer.

18. The electrostatic chuck according to claim 1, further comprising a bypass layer provided between the heater element and the ceramic dielectric substrate, the bypass layer being electrically conductive.

19. The electrostatic chuck according to claim 1, wherein a surface area of an upper surface of the first support plate is greater than a surface area of a lower surface of the second support plate.

20. The electrostatic chuck according to claim 1, wherein the first support plate includes a plurality of support portions, and the plurality of support portions is provided in a state of being mutually-independent.

21. The electrostatic chuck according to claim 1, further comprising a power supply terminal provided from the heater plate toward the base plate, the power supply terminal supplying electrical power to the heater plate.

22. The electrostatic chuck according to claim 21, wherein the power supply terminal includes:
a pin portion connected to a socket, the socket supplying electrical power from the outside;
a conducting lead portion finer than the pin portion;
a support portion connected to the conducting lead portion; and
a coupling portion connected to the support portion and coupled to the heater element.

\* \* \* \* \*